(12) United States Patent
Kim

(10) Patent No.: US 9,293,410 B2
(45) Date of Patent: Mar. 22, 2016

(54) SEMICONDUCTOR DEVICE

(71) Applicant: Samsung Electronics Co., Ltd., Suwon-Si, Gyeonggi-Do (KR)

(72) Inventor: Yang-Nam Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/452,821

(22) Filed: Aug. 6, 2014

(65) Prior Publication Data

US 2015/0155351 A1 Jun. 4, 2015

(30) Foreign Application Priority Data

Nov. 29, 2013 (KR) .................. 10-2013-0147484
Apr. 2, 2014 (KR) .................. 10-2014-0039504

(51) Int. Cl.
*H01L 23/522* (2006.01)
*H01L 23/532* (2006.01)

(52) U.S. Cl.
CPC ........ *H01L 23/5226* (2013.01); *H01L 23/5225* (2013.01); *H01L 23/53223* (2013.01); *H01L 23/53238* (2013.01); *H01L 23/53295* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,599,827 B1 | 7/2003 | Ngo et al. | |
| 7,037,744 B2 | 5/2006 | Colburn et al. | |
| 7,157,797 B2 | 1/2007 | Kojima | |
| 8,114,768 B2 | 2/2012 | Li et al. | |
| 8,120,179 B2 | 2/2012 | Chanda et al. | |
| 8,237,283 B2 | 8/2012 | Chandra et al. | |
| 2005/0098893 A1* | 5/2005 | Tsutsue et al. ............... | 257/758 |
| 2005/0272341 A1 | 12/2005 | Colburn et al. | |
| 2006/0091549 A1 | 5/2006 | Kojima | |
| 2007/0045850 A1* | 3/2007 | Nogami ............ | H01L 23/53295 257/758 |
| 2008/0174003 A1 | 7/2008 | Monthei et al. | |
| 2008/0303164 A1 | 12/2008 | Chandra et al. | |
| 2010/0044853 A1* | 2/2010 | Dekker et al. ............... | 257/692 |
| 2010/0164116 A1 | 7/2010 | Li et al. | |
| 2010/0224918 A1 | 9/2010 | Lee | |
| 2011/0108992 A1 | 5/2011 | Chanda et al. | |

FOREIGN PATENT DOCUMENTS

| | | |
|---|---|---|
| KR | 10-2000-0013287 A | 3/2000 |
| KR | 10-2002-0068901 A | 8/2002 |
| KR | 10-2005-0006468 A | 1/2005 |
| KR | 10-2005-0074088 A | 7/2005 |

(Continued)

*Primary Examiner* — Kimberly Rizkallah
*Assistant Examiner* — Bo Bin Jang
(74) *Attorney, Agent, or Firm* — Harness, Dickey & Pierce, P.L.C.

(57) ABSTRACT

A semiconductor device includes a lower interlayer insulating layer, a first stopper layer, and an upper interlayer insulating layer sequentially stacked on a substrate. First and second lower conductive layers, which are laterally separated from each other, are provided in the lower interlayer insulating layer. First and second upper via plugs are connected to the first and second lower conductive layers, respectively, through the upper interlayer insulating layer and the first stopper layer. Further, between the first and second upper via plugs, at least one line-shaped shield via plug extends into the lower interlayer insulating layer through the first stopper layer. The shield via plug is in an electrically-floating state.

20 Claims, 22 Drawing Sheets

(56) References Cited

FOREIGN PATENT DOCUMENTS

| KR | 10-0688488 | B1 | 3/2007 |
| KR | 10-2009-0122428 | A | 11/2009 |
| KR | 10-2010-0074652 | A | 7/2010 |

\* cited by examiner

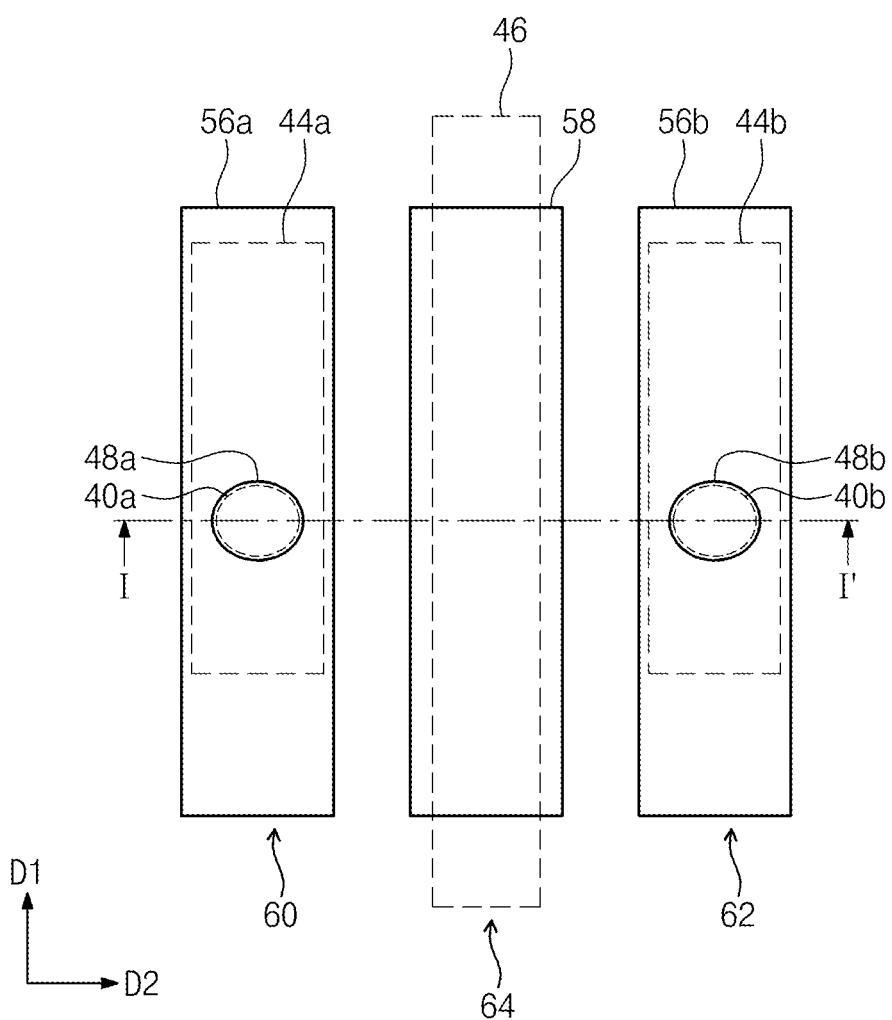

SEMICONDUCTOR DEVICE

CROSS-REFERENCE TO RELATED APPLICATIONS

This U.S. non-provisional patent application claims priority under 35 U.S.C. §119 to Korean Patent Application No. 10-2013-0147484, filed on Nov. 29, 2013 and 10-2014-0039504, filed on Apr. 2, 2014, in the Korean Intellectual Property Office, the disclosure of which is hereby incorporated by reference herein in its entirety.

BACKGROUND

The present disclosure herein relates to a semiconductor device, and in particular, to a semiconductor device including a copper-containing conductive structure. As the performance of semiconductor devices continues to advance, low-resistance conductive layers and fine patterns are more and more widely used in the semiconductor devices. For example, a metal layer has been used as a conductive layer for interconnection lines of the semiconductor device, and due to its low electric resistance, a copper layer has especially come into focus as the conductive layer of the semiconductor device. However, the copper layer suffers from electromigration phenomena, and this leads to major difficulties in using the copper layer as the interconnection lines.

SUMMARY

At least one example embodiment of the inventive concepts may provide a semiconductor device configured to reduce or prevent copper atoms from being diffused through an interface between a stopper layer and an interlayer insulating layer and thereby avoid short circuits between conductive layers.

At least one other example embodiment of the inventive concepts may provide a semiconductor device capable of reducing or preventing copper atoms from being diffused from a chip guard ring to a main chip region.

According to an example embodiment of the inventive concepts, a semiconductor device may include a lower interlayer insulating layer, a first stopper layer, and an upper interlayer insulating layer sequentially stacked on a substrate, first and second lower conductive layers provided in the lower interlayer insulating layer and laterally separated from each other, first and second upper via plugs penetrating the upper interlayer insulating layer and the first stopper layer, the first and second upper via plugs connected to the first and second lower conductive layers, respectively, and a shield via plug provided between the first and second upper via plugs to penetrate the first stopper layer and extend from the upper interlayer insulating layer into the lower interlayer insulating layer. The shield via plug may be a line-shaped pattern in a plan view, may include a conductive layer, and may be in an electrically-floating state.

In some embodiment, the device may further comprise first, second, and third upper conductive layers provided on the upper interlayer insulating layer and connected to the first upper via plug, the second upper via plug, and the shield via plug, respectively.

In some embodiment, the shield via plug may be provided to enclose a sidewall of the second upper via plug and at least a portion of a sidewall of the second lower conductive layer.

In some embodiment, the first and second lower conductive layers may comprise copper-containing material.

In some embodiment, the shield via plug may comprise a conductive layer and a via insulating layer provided on at least a side surface of the conductive layer.

In some embodiment, the shield via plug may comprise a conductive layer and a via insulating layer provided under the conductive layer.

In some embodiment, the lower interlayer insulating layer may comprises a first interlayer insulating layer, a second stopper layer, and a second interlayer insulating layer, which are sequentially stacked on the substrate, and the second interlayer insulating layer is provided between the second stopper layer and the first stopper layer.

In some embodiment, the shield via plug may be provided to penetrate the first stopper layer, the second interlayer insulating layer, and the second stopper layer and extend from the upper interlayer insulating layer into the first interlayer insulating layer.

In some embodiment, the device may further comprise first and second lower via plugs provided in the lower interlayer insulating layer and connected to the first and second lower conductive layers, respectively.

According to example embodiments of the inventive concepts, a semiconductor device may include a substrate including a main chip region, a scribe lane region, and a chip boundary region between the main chip region and the scribe lane region, a plurality of interlayer insulating layers provided on the substrate, the plurality of interlayer insulating layers including at least one stopper layer, a conductive structure provided in the plurality of interlayer insulating layers on the main chip region, a chip guard ring provided in the plurality of interlayer insulating layers on the chip boundary region to enclose continuously the main chip region, the chip guard ring connected to the substrate, and a shield via plug provided between the chip guard ring and the main chip region to enclose continuously the main chip region, the shield via plug penetrate the at least one stopper layer of the plurality of interlayer insulating layers, the shield via plug spaced apart from the substrate. The shield via plug may include a conductive layer and may be in an electrically-floating state.

In some embodiment, the shield via plug may be in a plural on the chip boundary region.

In some embodiment, the chip guard ring and the conductive structure may comprise a copper-containing conductive layer.

In some embodiment, the plurality of interlayer insulating layers may comprise a lower interlayer insulating layer, a first stopper layer, and an upper interlayer insulating layer sequentially stacked on the substrate, and the shield via plug may extend from the upper interlayer insulating layer into the lower interlayer insulating layer through the first stopper layer.

In some embodiment, each of the conductive structure and the chip guard ring may comprise a lower via plug, a lower conductive layer, an upper via plug, and an upper conductive layer. The lower via plug and the lower conductive layer may be sequentially stacked in the lower interlayer insulating layer, the upper via plug may be connected to the lower conductive layer through the upper interlayer insulating layer and the first stopper layer, and the upper conductive layer may be provided on the upper interlayer insulating layer and is connected to the upper via plug.

In some embodiment, the plurality of interlayer insulating layers may comprise a first interlayer insulating layer, a first stopper layer, a second interlayer insulating layer, a second stopper layer, and a third interlayer insulating layer sequentially stacked on the substrate, and the shield via plug may penetrate the third interlayer insulating layer, the second stopper layer, the second interlayer insulating layer, the first stopper layer and extends into the first interlayer insulating layer.

In some embodiment, each of the conductive structure and the chip guard ring may comprise a lower via plug, a lower conductive layer, an upper via plug, and an upper conductive layer. The lower via plug may be provided in the first interlayer insulating layer and the first stopper layer, the lower conductive layer may be provided in the second interlayer insulating layer and is connected to the lower via plug, the upper via plug may be connected to the lower conductive layer through the second stopper layer and the third insulating layer, and the upper conductive layer may be provided on the third interlayer insulating layer and is connected to the upper via plug.

In some embodiment, the shield via plug may comprise a conductive layer and a via insulating that is disposed on a side or bottom surface of the conductive layer.

According to another example embodiment of the inventive concepts, a semiconductor device may comprises a substrate including a main chip region, a scribe lane region, and a chip boundary region between the main chip region and the scribe lane region, a plurality of interlayer insulating layers provided on the substrate, the plurality of interlayer insulating layers including at least one stopper layer; a conductive structure provided in the plurality of interlayer insulating layers on the main chip region, the conductive structure comprising a first lower via plug, a first conductive layer, and a first upper via plug, wherein the first lower via plug is connected to the substrate, the first conductive layer is provided on the first lower via plug and is connected to the first lower via plug, and the first upper via plug is provided on the first conductive layer and is connected to the first conductive layer, a chip guard ring provided in the plurality of interlayer insulating layers on the chip boundary region, the chip guard ring continuously enclosing the main chip region, the chip guard ring comprising a second lower via plug, a second conductive layer, and a second upper via plug, wherein the second lower via plug is connected to the substrate, the second conductive layer is provided on the second lower via plug and is connected to the second lower via plug, and the second upper via plug is provided on the second conductive layer and is connected to the second conductive layer, and a shield via plug provided on the chip boundary region to enclose continuously the main chip region and provided between the conductive structure and the chip guard ring, to penetrate the at least one stopper layer of the plurality of interlayer insulating layers, the shield via plug spaced apart from the substrate, wherein the shield via plug comprises the same conducting material as the second upper via plug.

In some embodiment, the shield via plug may have a bottom surface lower than a top surface of the second conductive layer.

In some embodiment, a top surface of the shield via plug may be substantially on a same level as a top surface of the second upper via plug, wherein a height of the shield via plug is greater than that of the second upper via plug.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1 is a plan view schematically illustrating a semiconductor device according to example embodiments of the inventive concepts.

Figure 2A:
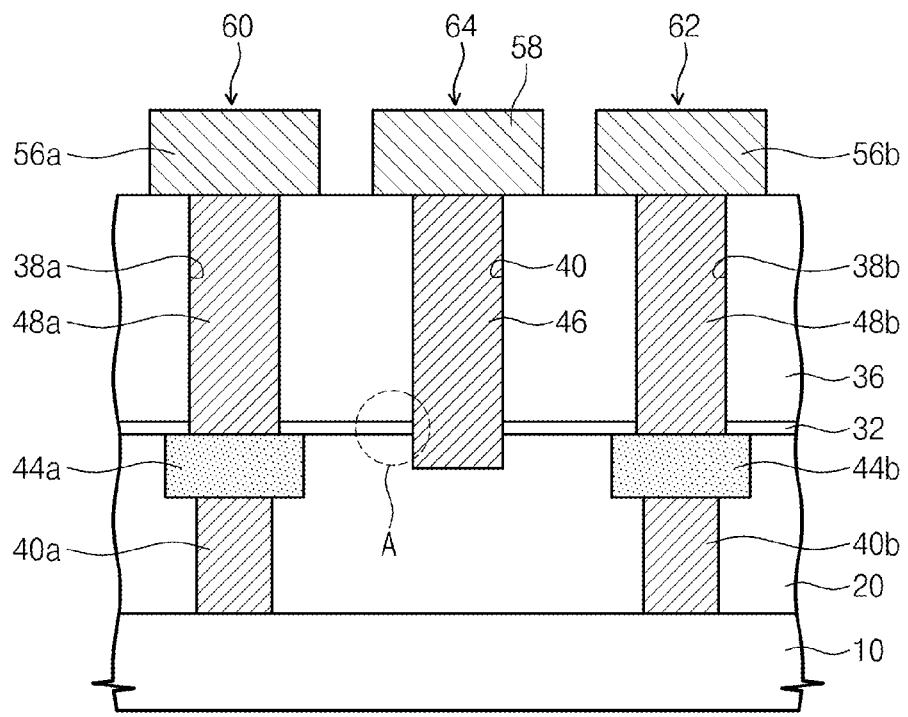
FIG. 2A is a sectional view taken along line I-I' of FIG. 1 to schematically illustrate a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

Figure 2B:
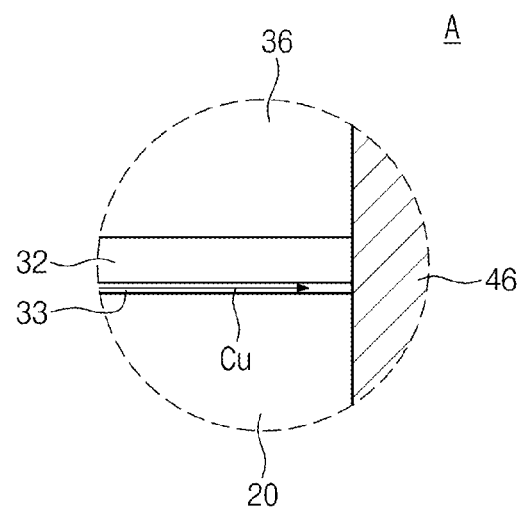
FIG. 2B is an enlarged view of a portion "A" of FIG. 2A.
Figure 3:
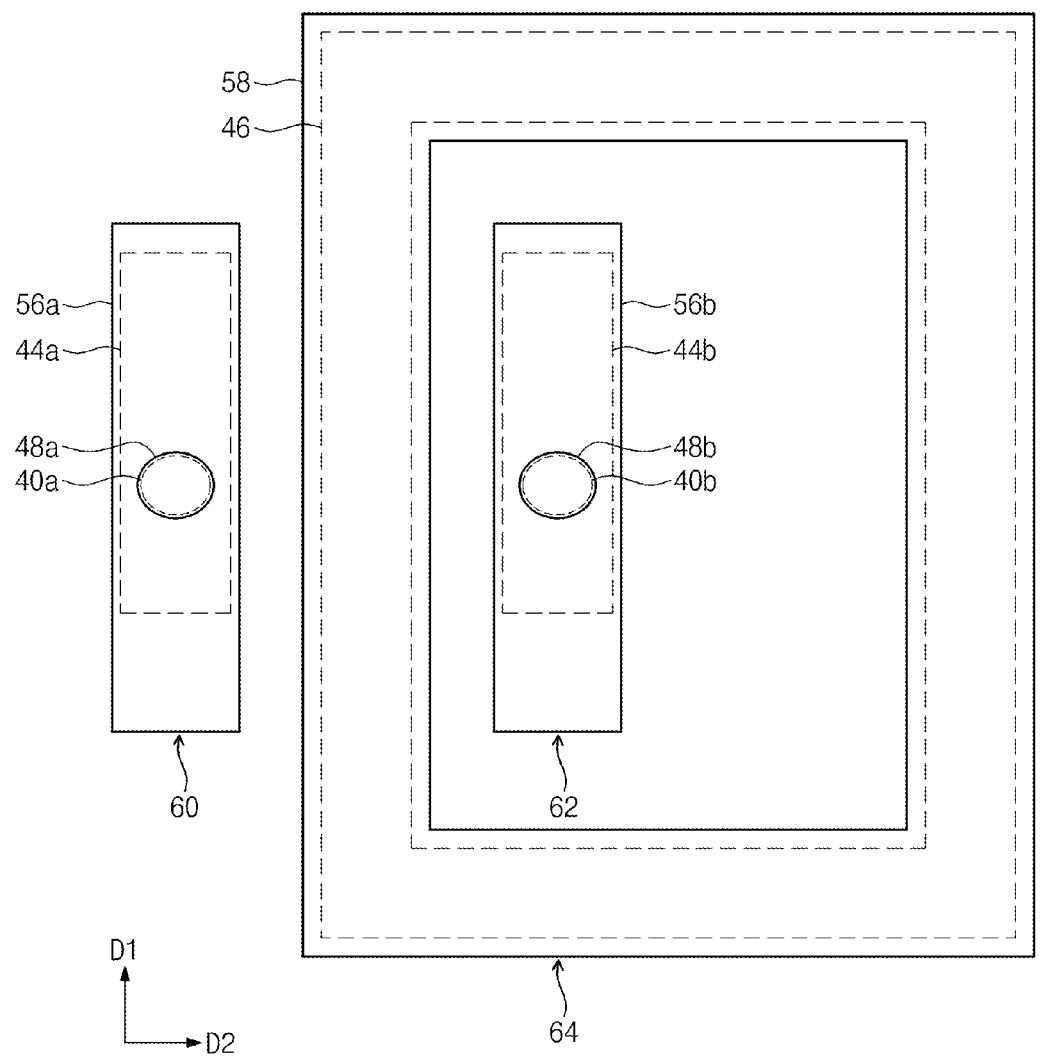
FIG. 3 is a plan view illustrating a semiconductor device according to a modification of example embodiments of the inventive concepts.

FIG. 1 is a plan view schematically illustrating a semiconductor device according to example embodiments of the inventive concepts. FIG. 2A is a sectional view taken along line I-I' of FIG. 1 to schematically illustrate a semiconductor device according to example embodiments of the inventive concepts, and FIG. 2B is an enlarged view of a portion "A" of FIG. 2A. FIG. 3 is a plan view illustrating a semiconductor device according to a modification of example embodiments of the inventive concepts.

Referring to FIGS. 1, 2A, and 2B, a semiconductor device may include a lower interlayer insulating layer 20, a first stopper layer 32, an upper interlayer insulating layer 36, a first conductive structure 60, a second conductive structure 62, and a shield via structure 64, which are formed on a substrate 10. The shield via structure 64 may be provided between the first conductive structure 60 and the second conductive structure 62. The substrate 10 may be a substrate (e.g., a wafer) containing a semiconductor material. For example, the semiconductor material may include a silicon-containing material. The substrate 10 may include an integrated circuit (not shown), which may be composed of transistors. The substrate 10 may include at least one insulating layer. The substrate 10 may include at least one conductive layer and at least one via plug in the at least one insulating layer. Each of the interlayer insulating layers 20 and 36 may include a plurality of stacked insulating layers. The interlayer insulating layers 20 and 36 may be formed of or include a doped silicon oxide with a small amount of impurities or an undoped silicon oxide without impurity. For example, each of the interlayer insulating layers 20 and 36 may be formed of at least one of BSG (boron silicate glass), PSG (phosphorous silicate glass), BPSG (boron phosphorous silicate glass), SiOF (silicon oxy fluoride), SiCHO (silicon carbonic hydro oxide), TEOS (tetra ethyl ortho silicate), or USG (undoped silicate glass). The interlayer insulating layers 20 and 36 may be formed by at least one of various deposition methods, such as a chemical vapor deposition method, in which heat or plasma is used, or a spin-coating method.

The first stopper layer 32 may be formed of a material having an etch selectivity with respect to the interlayer insulating layers 20 and 36. For example, the first stopper layer 32 may serve as an etch stopper preventing first and second lower conductive layers 44a and 44b from being etched when the upper interlayer insulating layer 36 is etched. The first stopper layer 32 may be formed of an insulating material, whose density is higher than that of the silicon oxide layer. For example, the first stopper layer 32 may include silicon nitride, silicon carbonitride, or silicon oxynitride. The interlayer insulating layers 20 and 36 may be formed thicker than the first stopper layer 32.

The first conductive structure 60 may include a first lower via plug 40a, a first lower conductive layer 44a, a first upper via plug 48a, and a first upper conductive layer 56a, which are sequentially stacked on the substrate 10. The second conductive structure 62 may include a second lower via plug 40b, a second lower conductive layer 44b, a second upper via plug 48b, and a second upper conductive layer 56b, which are sequentially stacked on the substrate 10. The first conductive structure 60 and the second conductive structure 62 may be disposed spaced apart from each other in a second direction D2, as shown in FIG. 1.

In the first conductive structures 60, the first lower via plug 40a and the first lower conductive layer 44a may be provided in the lower interlayer insulating layer 20. The first lower via plug 40a may be connected to the substrate 10. For example, the first lower via plug 40a may be connected to the integrated circuit of the substrate 10. In some embodiments, the first lower via plug 40a may be connected to the integrated circuit of the substrate 10 via at least one conductive layer and at least one via plug provided thereunder. The first lower conductive layer 44a may be connected to the first lower via plug 40a and may be a linear interconnection line extending along a first direction D1, as shown in FIG. 1. In some embodiments, the first lower conductive layer 44a may be an interconnection line extending along a direction different from the first direction D1. The first lower conductive layer 44a may have a top surface that is substantially coplanar with that of the lower interlayer insulating layer 20. The first upper via plug 48a may be connected to the first lower conductive layer 44a through the upper interlayer insulating layer 36 and the first stopper layer 32. For example, the first upper via plug 48a may be formed by filling a first via trench 38a with a conductive layer. Here, the first via trench 38a is formed to penetrate the upper interlayer insulating layer 36 and the first stopper layer 32 which is disposed on the first lower conductive layer 44a. The first upper conductive layer 56a may be formed on the upper interlayer insulating layer 36 and may be connected to the first upper via plug 48a. As shown in FIG. 1, the first upper conductive layer 56a may be an interconnection line that is longer than the first lower conductive layer 44a and extends along the first direction D1. However, example embodiments of the inventive concepts may not be limited thereto. For example, the first upper conductive layer 56a may be an interconnection line that is shorter than the first lower conductive layer 44a or extends along a direction different from the first direction D1.

In the second conductive structure 62, the second lower via plug 40b and the second lower conductive layer 44b may be provided in the lower interlayer insulating layer 20. The second lower via plug 40b may be connected to the substrate 10. For example, the second lower via plug 40b may be connected to the integrated circuit formed on the substrate 10. In some embodiments, the second lower via plug 40b may be connected to the integrated circuit of the substrate 10 via at least one conductive layer and at least one via plug disposed thereunder. The second lower conductive layer 44b may be connected to the second lower via plug 40b and may be a linear interconnection line extending along the first direction D1, as shown in FIG. 1. However, example embodiments of the inventive concepts may not be limited thereto. For example, the second lower conductive layer 44b may be an interconnection line extending along a direction different from the first direction D2. The second lower conductive layer 44b may have a top surface that is substantially coplanar with that of the lower interlayer insulating layer 20. The second upper via plug 48b may be connected to the second lower conductive layer 44b through the upper interlayer insulating layer 36 and the first stopper layer 32. For example, the second upper via plug 48b may be formed by filling a second via trench 38b with a conductive layer. Here, the second via trench 38b may be formed to penetrate the upper interlayer insulating layer 36 and the first stopper layer 32 on the second lower conductive layer 44b. The second upper conductive layer 56b may be formed on the upper interlayer insulating layer 36 and be connected to the second upper via plug 48b. As shown in FIG. 1, the second upper conductive layer 56b may be an interconnection line that is longer than the second lower conductive layer 44b and extends along the first direction D1. However, example embodiments of the inventive concepts may not be limited thereto. For example, the second upper conductive layer 56b may be an interconnection line that is shorter than the second lower conductive layer 44b or extends along a direction different from the first direction D1.

In the first and second conductive structures 60 and 62, each of the via plugs 40a, 40b, 48a, and 48b may be provided in the form of a hole. The via plugs 40a, 40b, 48a, and 48b may be formed of or include at least one conductive layer (e.g., tungsten W). Each of the via plugs 40a, 40b, 48a, and 48b may further include a barrier layer surrounding the conductive layer thereof. For example, the barrier layer may include at least one of titanium (Ti), titanium nitride (TiN), or tungsten nitride (WN). Each or both of the first and second lower conductive layers 44a and 44b may be a metal conductive layer. For example, the first and second lower conductive layers 44a and 44b may include copper (Cu). The first and second lower conductive layers 44a and 44b may further include a barrier layer containing a metallic material, such as titanium (Ti), titanium nitride (TiN), or tungsten nitride (WN). In the case where the first and second lower conductive layers 44a and 44b are formed of a copper-containing material, it is desirable to reduce or prevent copper atoms from being diffused through an interface between the lower interlayer insulating layer 20 and the first stopper layer 32. In addition, in the case where the interlayer insulating layers 20 and 36 are formed of an oxide-based material and the first stopper layer 32 is formed of a nitride-based material, thermal stresses applied thereto or thermal expansion coefficients thereof may be largely different from each other. Moreover, if the first stopper layer 32 exhibits a weakened adhesive strength on or near a top surface of the first lower conductive layer 44a, the first stopper layer 32 may be detached from the underlying layer (e.g., the lower interlayer insulating layer 20) and thereby to form a gap 33 as shown in FIG. 2B, when thermal stress is applied to the semiconductor device with the conductive structures 60 and 62 in a subsequent process. The gap 33 may allow copper atoms to be diffused from the first lower conductive layer 44a to neighboring elements, and this may lead to increased possibility for electric failures (e.g., short circuits) between the first and second lower conductive layers 44a and 44b. For this reason, it is desirable to suppress the gap 33 from being formed between the lower interlayer insulating layer 20 and the first stopper layer 32 and thereby to reduce or prevent the copper diffusion from occurring. As will be described below, these may be attained by providing the shield via structure 64.

The shield via structure 64 may be disposed between the first and second conductive structures 60 and 62 that are spaced apart from each other in the second direction D2. As shown in FIGS. 1 and 2A, the shield via structure 64 may be disposed substantially equidistant from the first and second conductive structures 60 and 62, but example embodiments of the inventive concepts may not be limited thereto. The shield via structure 64 may include a shield via plug 46 and a third upper conductive layer 58. The shield via plug 46 may be provided between the first and second upper via plugs 48a and 48b to penetrate the upper interlayer insulating layer 36 and the first stopper layer 32 and extend into the lower interlayer insulating layer 20. For example, the shield via plug 46 may have a bottom surface that is positioned at a lower level than that of the top surface of the lower interlayer insulating layer 20. Accordingly, the bottom surface of the shield via plug 46 may be lower than the top surface of the first lower conductive layer 44a. As shown in FIG. 1, the shield via plug 46 may be a linear pattern extending along the first direction D1, when viewed in a plan view. In some embodiments, the shield via plug 46 may be formed to be longer than the first lower conductive layer 44a. The shield via plug 46 may be formed in a third via trench 40, which may be formed between the first and second via trenches 38a and 38b to penetrate the upper interlayer insulating layer 36 and the first stopper layer 32 and extend into the lower interlayer insulating layer 20. For example, the third via trench 40 may be concurrently formed using the same process as that for forming the first and second via trenches 38a and 38b. In the formation of the first via trench 38a, the second via trench 38b, and the third via trench 40, the upper interlayer insulating layer 36 and the first stopper layer 32 may be over-etched. Here, since there is no conductive layer under the third via trench 40, an etching amount of the lower interlayer insulating layer 20 may be increased. For example, the lower interlayer insulating layer 20 may be etched such that the third via trench 40 has a bottom surface lower than the top surface of the first lower conductive layer 44a. In some embodiments, the lower interlayer insulating layer 20 may be etched such that the third via trench 40 has a bottom surface lower than the bottom surface of the first lower conductive layer 44a. The third via trench 40 may penetrate the interface between the lower interlayer insulating layer 20 and the first stopper layer 32 and moreover partially extend into the lower interlayer insulating layer 20. Further, the third via trench 40 may be formed to be longer than the first lower conductive layer 44a in the first direction D1. The shield via plug 46 may include a conductive layer filling the third via trench 40. The conductive layer for the shield via plug 46 may be the same conductive layer as that for the first and second upper via plugs 48a and 48b. For example, the shield via plug 46 may be formed of a material containing tungsten (W). In addition, the shield via plug 46 may further include a barrier layer, which may be formed to surround the conductive layer. The barrier layer may include, for example, at least one of titanium (Ti), titanium nitride (TIN), or tungsten nitride (WN). Since the shield via plug 46 is formed to cut vertically the interface between the first stopper layer 32 and the lower insulating layer 20, it is possible to suppress or prevent copper atoms from being diffused through the gap 33 serving as the copper diffusion path. Further, when viewed in a plan view as shown in FIG. 1, since the shield via plug 46 is formed to be longer than the first lower conductive layer 44a, it is possible to reduce or prevent copper from being diffused in a horizontal direction. The third upper conductive layer 58 may be formed on the upper interlayer insulating layer 36 and be connected to the shield via plug 46. The third upper conductive layer 58 may extend along the first direction D1 parallel to the shield via plug 46 and be overlapped with the shield via plug 46. The presence of the third upper conductive layer 58 in conjunction with the shield via plug 46 may make it possible to prevent the first stopper layer 32 from being detached from the lower interlayer insulating layer 20. In some embodiments, the third upper conductive layer 58 may be concurrently formed by the same process for forming the first and second upper conductive layers 56a and 56b. The first to third upper conductive layers 56a, 56b, and 58 may be formed of or include at least one of metal conductive materials (e.g., aluminum (Al) or aluminum alloys). In other embodiments, the shield via structure 64 may include only the shield via plug 46, without the third upper conductive layer 58. The shield via structure 64 may not be connected to other conductive structures and may not be used as an interconnection line. In other words, the shield via plug 46 may be in an electrically-floating state.

Referring to FIGS. 2A and 3, when viewed in a plan view, the shield via structure 64 may be provided to surround the second conductive structure 62. For example, the shield via plug 46 may be provided to continuously enclose a sidewall of the second upper via plug 48b and at least a portion of the second lower conductive layer 44b, and thus, it is possible to suppress or prevent copper atoms from being diffused to neighboring elements. The third upper conductive layer 58 may be formed to have the same shape as that of the shield via plug 46. For example, the third upper conductive layer 58 may be provided in the form of a closed loop that is overlapped with the shield via plug 46 to enclose the second conductive structure 62, but example embodiments of the inventive concepts may not be limited thereto. For example, the third upper conductive layer 58 may be at least one discontinuous pattern that is overlapped with the shield via plug 46 and encloses discontinuously the second conductive structure 62. In other embodiments, the third upper conductive layer 58 may not be formed on the upper interlayer insulating layer 36.

FIGS. 4 through 9 are sectional views taken along line I-I' of FIG. 1 to schematically illustrate semiconductor devices according to other example embodiments of the inventive concepts. For concise description, an element previously described with reference to FIGS. 1 through 3 may be identified by a similar or identical reference number without repeating an overlapping description thereof.

Figure 4:
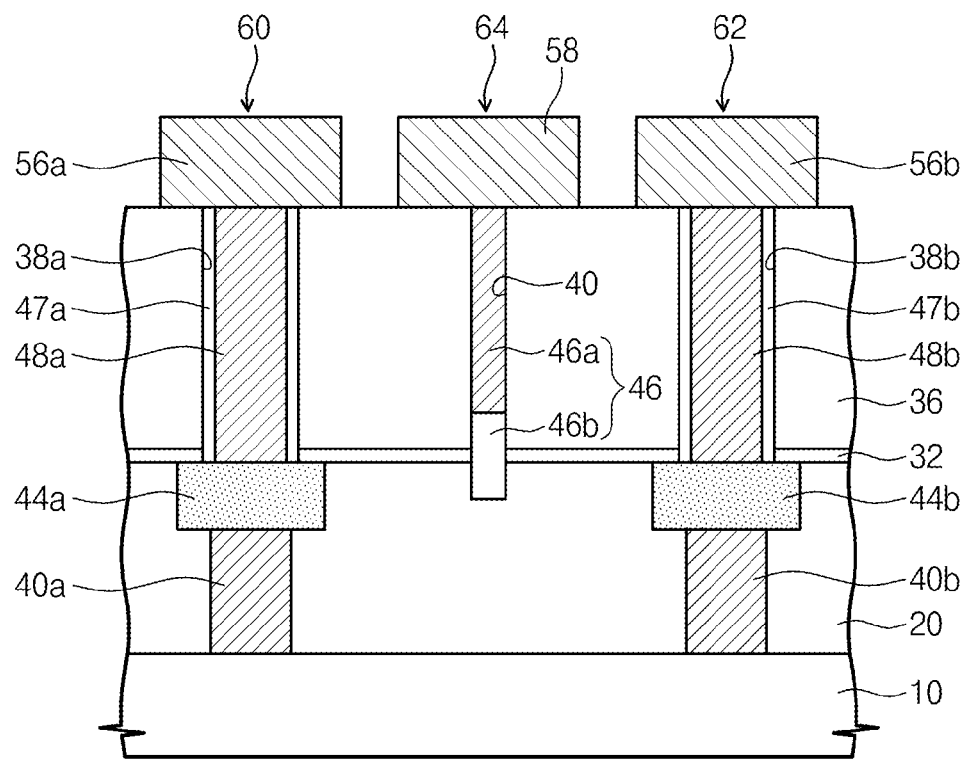
FIGS. 4 through 9 are sectional views taken along line I-I' of FIG. 1 to schematically illustrate semiconductor devices according to other example embodiments of the inventive concepts.

Referring to FIGS. 1 and 4, a semiconductor device may include a shield via plug 46 including a shield via conductive layer 46a and a shield via insulating layer 46b coupled thereto. The shield via insulating layer 46b may be disposed under the shield via conductive layer 46a and coupled to the shield via conductive layer 46a. The shield via conductive layer 46a may include a conductive material (for example, tungsten (W)). The shield via insulating layer 46b may be formed in a lower portion of the third via trench 40. The shield via insulating layer 46b may be formed to penetrate vertically a portion of the upper interlayer insulating layer 36 and the first stopper layer 32 and extend into the lower interlayer insulating layer 20. Accordingly, it is possible to suppress or prevent copper atoms from being diffused from the first lower conductive layer 44a to neighboring elements through the interface between the first stopper layer 32 and the lower interlayer insulating layer 20. The shield via insulating layer 46b may be formed of, for example, silicon oxide, silicon nitride, silicon carbonitride, silicon oxynitride, or other suitable insulating materials. Other suitable insulating materials may include oxides (e.g., hafnium oxide (HfO), alumina ($Al_2O_3$)) or silicon oxides doped with impurities (e.g., boron (B), phosphorous (P), fluorine (F), and so forth). A first via insulating layer 47a may be provided on a sidewall of the first upper via plug 48a, and a second via insulating layer 47b may be provided on a sidewall of the second upper via plug 48b. For example, the first via insulating layer 47a on a sidewall of the first via trench 38a may enclose the sidewall of the first upper via plug 48a, and the second via insulating layer 47b on a sidewall of the second via trench 38b may enclose the sidewall of the second upper via plug 48b. A width of the shield via plug 46 may be smaller than that of each of the first and second lower via plugs 48a and 48b. The first and second via insulating layers 47a and 47b may be formed using the same process for forming the shield via insulating layer 46b. For example, the third via trench 40 may be formed to be narrower than each of the first and second via trenches 38a and 38b, and an insulating layer may be formed in the trenches 38a, 38b, and 40. Here, the insulating layer may fill the third via trench 40 and conformally cover inner surfaces of the first and second via trenches 38a and 38b. Thereafter, the insulating layer may be etched to form the first via insulating layer 47b on the sidewall of the first via trench 38a, form the second via insulating layer 47b on the sidewall of the second via trench 38b, and form the shield via insulating layer 46b filling a lower portion of the third via trench 40. Next, the trenches 38a, 38b, and 40 may be filled with a conductive layer to form the first and second upper via plugs 48a and 48b and the shield via conductive layer 46a.

Figure 5:
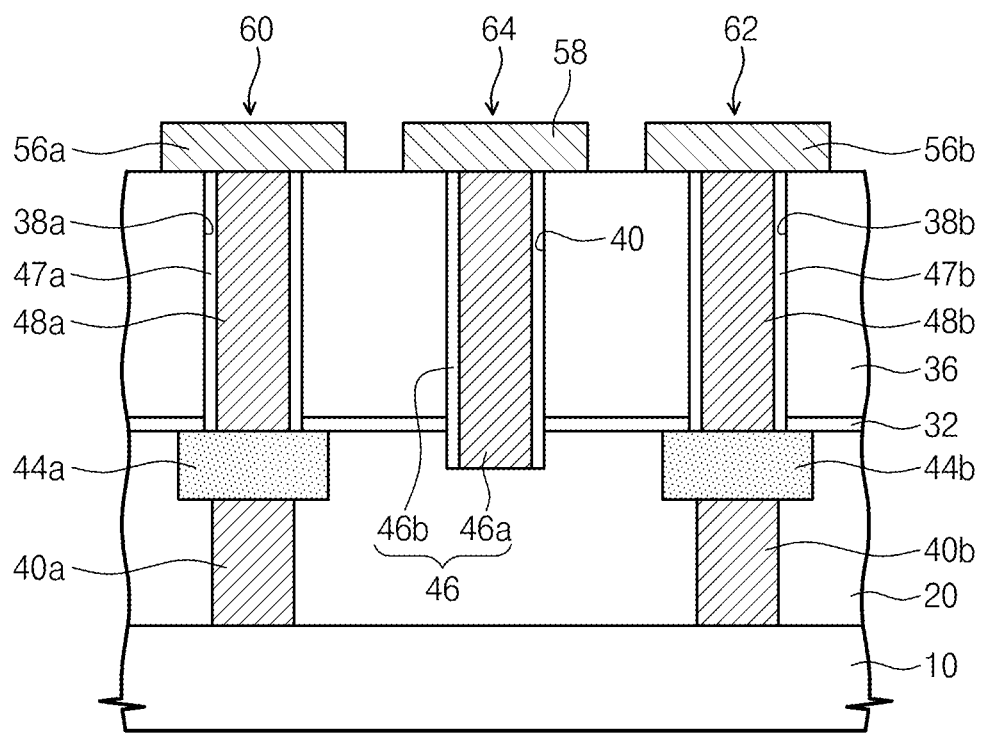

Referring to FIGS. 1 and 5, a semiconductor device may include a shield via plug 46 including a shield via conductive layer 46a and a shield via insulating layer 46b. The shield via insulating layer 46b may be on a sidewall of the shield via conductive layer 46a coupled to the shield via conductive layer 46a. The shield via insulating layer 46b may enclose the shield via conductive layer 46a. The shield via conductive layer 46a may include a metal conductive material. The metal conductive material may be, for example, tungsten (W). The shield via insulating layer 46b may be formed on the sidewall of the third via trench 40. The shield via insulating layer 46b and the shield via conductive layer 46a may be formed to penetrate vertically the upper interlayer insulating layer 36 and the first stopper layer 32 and extend into the lower interlayer insulating layer 20. Accordingly, it is possible to suppress or prevent copper atoms from being diffused from the first lower conductive layer 44a to neighboring elements through the interface between the first stopper layer 32 and the lower interlayer insulating layer 20. Further, it is also possible to suppress or prevent copper atoms from being diffused from the second lower conductive layer 44b to neighboring elements through the interface between the first stopper layer 32 and the lower interlayer insulating layer 20. The shield via insulating layer 46b may be formed of the same material as that described with reference to FIG. 4. The first via insulating layer 47a may be provided on the sidewall of the first upper via plug 48a, and the second via insulating layer 47b may be provided on the sidewall of the second upper via plug 48b. For example, the first via insulating layer 47a on a sidewall of the first via trench 38a may enclose the sidewall of the first upper via plug 48a, and the second via insulating layer 47b on the sidewall of the second via trench 38b may enclose the sidewall of the second upper via plug 48b. The first and second via insulating layers 47a and 47b may be formed using the same process for forming the shield via insulating layer 46b. For example, the first and second via trenches 38a and 38b and the third via trench 40 there between may be formed, and then, an insulating layer may be formed in the trenches 38a, 38b, and 40. Here, the insulating layer may be formed to conformally cover an inner surface of each of the trenches 38a, 38b, and 40. Thereafter, the insulating layer in the trenches 38a, 38b, and 40 may be etched to form the first via insulating layer 47b in the first via trench 38a, form the second via insulating layer 47b in the second via trench 38b, and form the shield via insulating layer 46b in the third via trench 40. Next, the trenches 38a, 38b, and 40 may be filled with a conductive layer to form the first and second upper via plugs 48a and 48b and the shield via conductive layer 46a.

Figure 6:
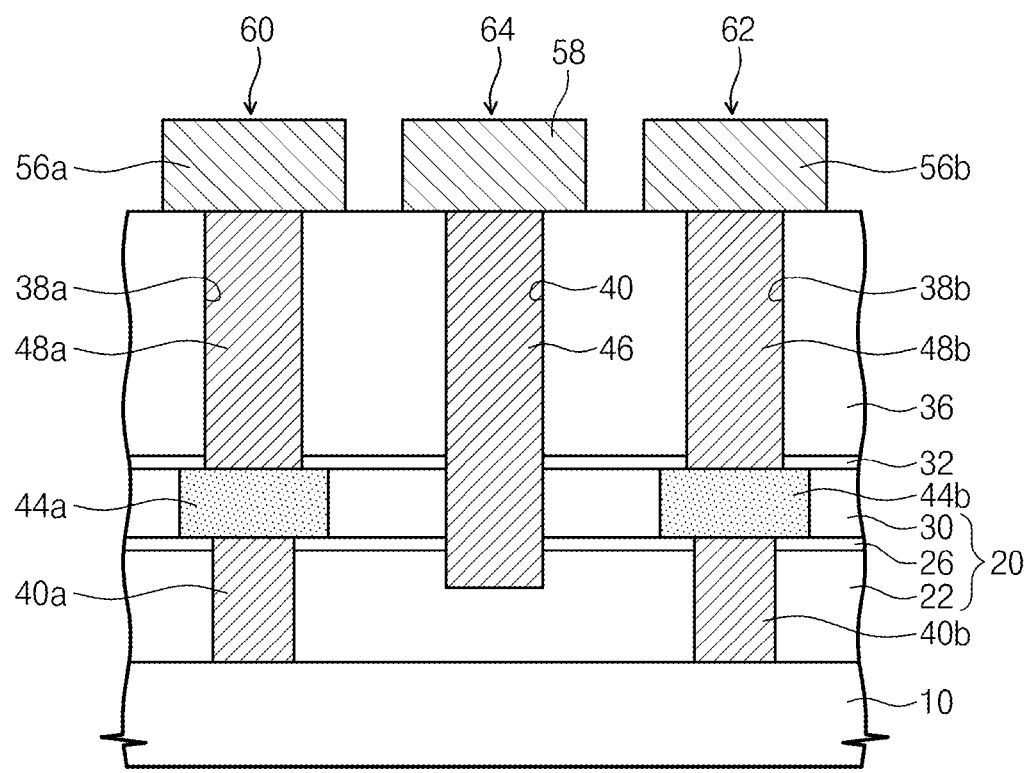

Referring to FIGS. 1 and 6, a semiconductor device may include the lower interlayer insulating layer 20, the first stopper layer 32, the upper interlayer insulating layer 36, the first conductive structure 60, the second conductive structure 62, and the shield via structure 64, which are formed on the substrate 10. The shield via structure 64 may be provided between the first conductive structure 60 and the second conductive structure 62. The lower interlayer insulating layer 20 may include a first interlayer insulating layer 22, a second stopper layer 26, and a second interlayer insulating layer 30. Each of the first interlayer insulating layer 22 and the upper interlayer insulating layer 36 may include a plurality of stacked insulating layers. The first and second conductive structures 60 and 62 may be provided through or in the first interlayer insulating layer 22, the second stopper layer 26, the second interlayer insulating layer 30, the first stopper layer 32, and the upper interlayer insulating layer 36.

Each of the interlayer insulating layers 22, 30, and 36 and the stopper layers 26 and 32 may include the same insulating material as a corresponding one of the previous embodiments described with reference to FIG. 2A. The interlayer insulating layers 22, 30, and 36 may be formed to be thicker than each of the stopper layers 26 and 32. Further, each of the first and second conductive structures 60 and 62 and the shield via structure 64 may include the same conductive material as a corresponding one of the previous embodiments described with reference to FIG. 2A.

The first conductive structure 60 may include the first lower via plug 40a, the first lower conductive layer 44a, the first upper via plug 48a, and the first upper conductive layer 56a, which are sequentially stacked on the substrate 10. The second conductive structure 62 may include the second lower via plug 40b, the second lower conductive layer 44b, the second upper via plug 48b, and the second upper conductive layer 56b, which are sequentially stacked on the substrate 10. The first and second lower via plugs 40a and 40b may be provided to vertically penetrate the second stopper layer 26 and the first interlayer insulating layer 22. The first and second lower conductive layer 44a and 44b may be provided in the second interlayer insulating layer 30 and between the first stopper layer 32 and the second stopper layer 26. In other words, the first and second lower conductive layers 44a and 44b may have top surfaces that are in contact with the first stopper layer 32 and are substantially coplanar with that of the second interlayer insulating layer 30. Further, the first and second lower conductive layers 44a and 44b may have bottom surfaces that are in contact with the second stopper layer 26 and are substantially coplanar with that of the second interlayer insulating layer 30. In example embodiments, the shield via structure 64 may be provided to suppress or prevent copper atoms from being diffused from the first lower conductive layer 44a to neighboring elements through the interfaces between the second interlayer insulating layer 30 and the first and second stopper layers 32 and 26. The shield via structure 64 may include the shield via plug 46, which penetrates the upper interlayer insulating layer 36 and the first stopper layer 32 and extends into the lower interlayer insulating layer 20, and the third upper conductive layer 58 provided on the upper interlayer insulating layer 36. For example, the shield via plug 46 may be formed to penetrate vertically the upper interlayer insulating layer 36, the first stopper layer 32, the second interlayer insulating layer 30, and the second stopper layer 26 and be inserted into the first interlayer insulating layer 22, and thus, the interfaces between the second interlayer insulating layer 30 and the stopper layers 26 and 32 may be cut by the shield via plug 46. As shown in FIG. 1, the shield via plug 46 may be provided in the form of a linearly-extending pattern. The shield via plug 46 may have a bottom surface that is lower than the bottom surfaces of the first and second lower conductive layers 44a and 44b. In other embodiments, the shield via structure 64 may include only the shield via plug 46, without the third upper conductive layer 58. The shield via structure 64 may not be connected to other conductive structures and may not be used as an interconnection line. In other words, the shield via plug 46 may be in an electrically-floating state. The first and second upper via plugs 48a and 48b may be formed using the same process. The shield via plug 46 may be formed using a process different from the process for forming the first and second upper via plugs 48a and 48b. For example, the formation of the shield via plug 46 may be performed before or after the formation of the first and second upper via plugs 48a and 48b. The first to third upper conductive layers 55a, 56b, and 58 may be concurrently formed using the same process.

Figure 7:
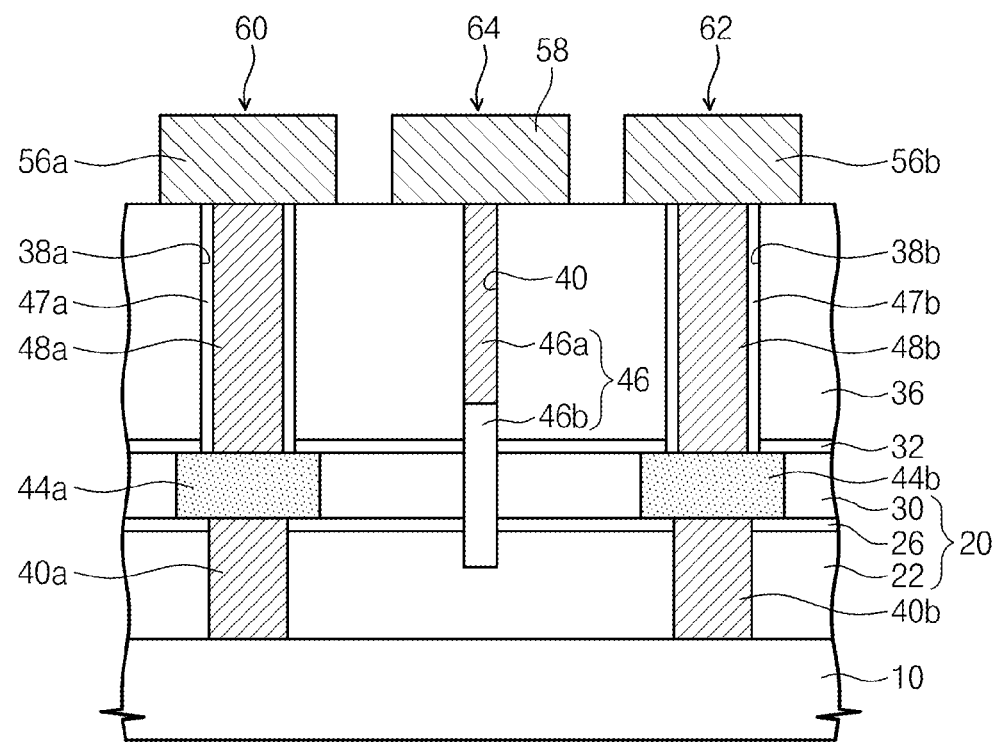

Referring to FIGS. 1 and 7, a semiconductor device may include the shield via plug 46 including the shield via conductive layer 46a and the shield via insulating layer 46b. In example embodiments, the shield via conductive layer 46a may be formed to vertically penetrate a portion of the upper interlayer insulating layer 36, and the shield via insulating layer 46b may be formed below the shield via conductive layer 46a to penetrate a portion of the upper interlayer insulating layer 36, the first and second stopper layers 26 and 32, and the second interlayer insulating layer 30 between the first and second stopper layers 26 and 32 and extend into the first interlayer insulating layer 22. The shield via insulating layer 46b may suppress or prevent copper atoms from being diffused through the interfaces between the stopper layers 26 and 32 and the second interlayer insulating layer 30. The shield via plug 46 with the shield via insulating layer 46b may be in an electrically-floating state, but example embodiments of the inventive concepts may not be limited thereto. For example, the shield via plug 46 may also be used as an interconnection line. The first via insulating layer 47a may be provided on the sidewall of the first upper plug 48a, and the second via insulating layer 47b may be provided on the sidewall of the second upper plug 48b.

Figure 8:
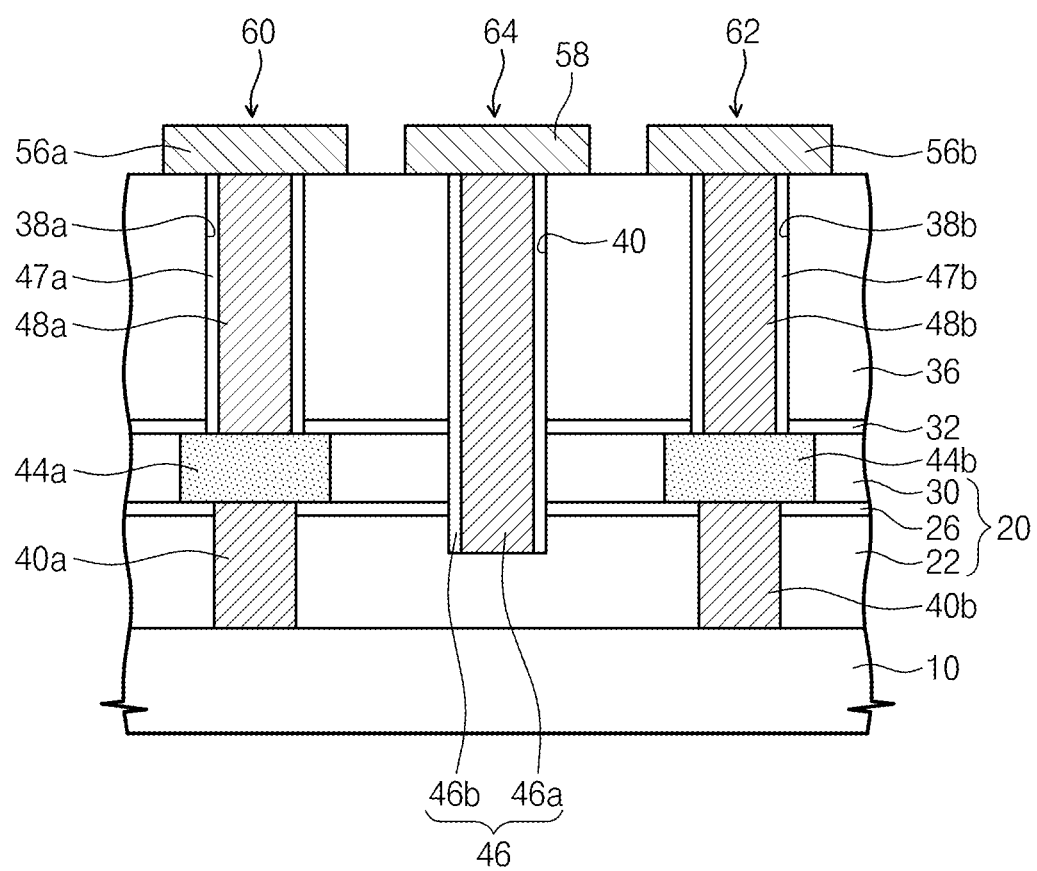

Referring to FIGS. 1 and 8, a semiconductor device may include the shield via plug 46 including the shield via conductive layer 46a and the shield via insulating layer 46b disposed on a sidewall thereof. The shield via insulating layer 46a may enclose the shield via conductive layer 46b. The shield via insulating layer 46b and the shield via conductive layer 46a may be provided to vertically penetrate the upper interlayer insulating layer 36, the first and second stopper layers 26 and 32, and the second interlayer insulating layer 30 between the first and second stopper layers 26 and 32 and extend into the first interlayer insulating layer 22. The shield via insulating layer 46b and the shield via conductive layer 46a may suppress or prevent copper atoms from being diffused through the interfaces between the stopper layers 26 and 32 and the second interlayer insulating layer 30. The shield via plug 46 with the shield via insulating layer 46b may be in an electrically-floating state, but example embodiments of the inventive concepts may not be limited thereto. For example, the shield via plug 46 may also be used as an interconnection line. The first via insulating layer 47a may be provided on the sidewall of the first upper via plug 48a, and the second via insulating layer 47b may be provided on the sidewall of the second upper via plug 48b.

Figure 9:
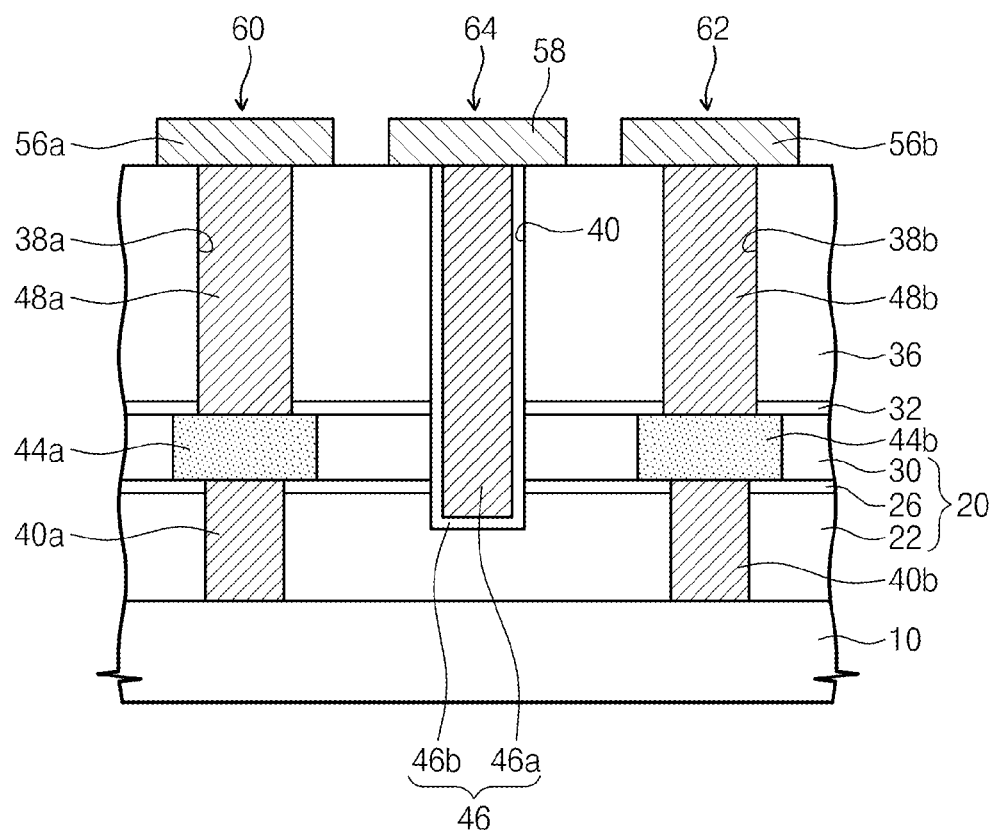

Referring to FIGS. 1 and 9, a semiconductor device may include the shield via plug 46 including the shield via conductive layer 46a and the shield via insulating layer 46b disposed on side and bottom surfaces thereof. The shield via insulating layer 46b may be provided to cover the side and bottom surfaces of the shield via conductive layer 46a. The shield via insulating layer 46b and the shield via conductive layer 46a may be provided to vertically penetrate the upper interlayer insulating layer 36, the first and second stopper layers 26 and 32, and the second interlayer insulating layer 30 between the first and second stopper layers 26 and 32 and extend into the first interlayer insulating layer 22. The shield via insulating layer 46b and the shield via conductive layer 46a may suppress or prevent copper atoms from being diffused through the interfaces between the stopper layers 26 and 32 and the second interlayer insulating layer 30. The shield via plug 46 with the shield via insulating layer 46b may be in an electrically-floating state, but example embodiments of the inventive concepts may not be limited thereto. For example, the shield via plug 46 may also be used as an interconnection line. The first via insulating layer 47a and the second via insulating layer 47b shown in FIG. 8 may not be provided on the sidewalls of the first and second upper via conductive plugs 48a and 48b.

As shown in FIG. 3, when viewed in a plan view, each of the shield via structures 64 described with reference to FIGS. 4 through 9 may be provided to enclose continuously the second conductive structure 62. For example, the shield via plug 46 may be provided to enclose continuously at least a portion of the sidewall of the second lower via plug 40b and the sidewall of the second lower conductive layer 44b.

Figure 10:
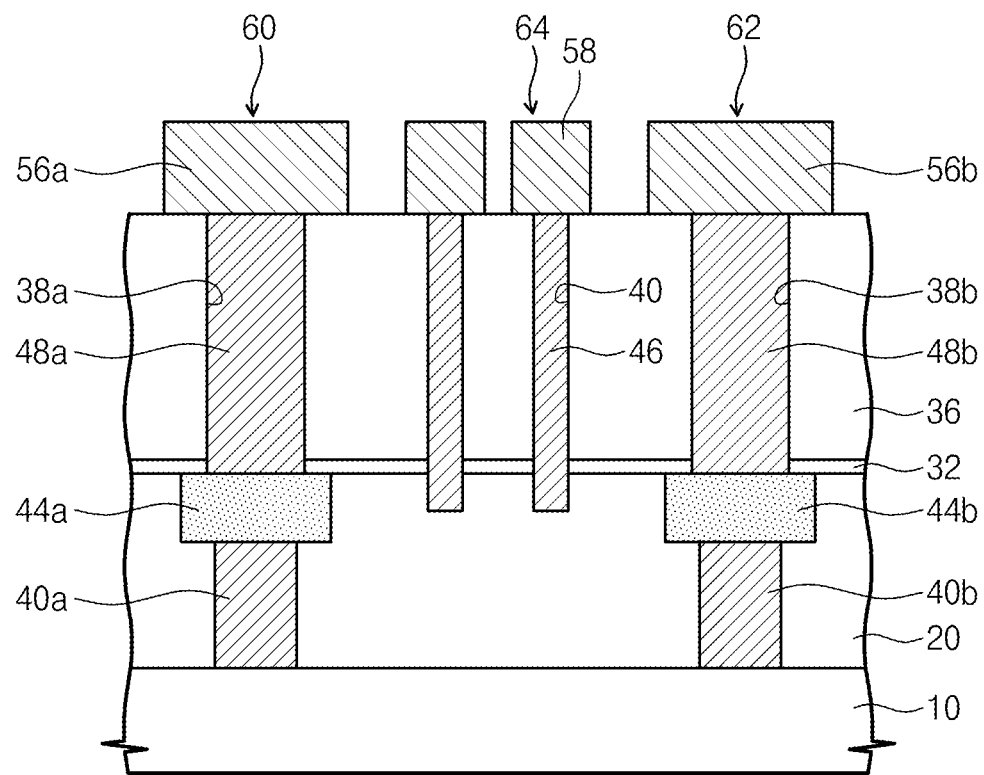
FIGS. 10 and 11 are sectional views schematically illustrating semiconductor devices according to according to still other example embodiments of the inventive concepts.
Figure 11:
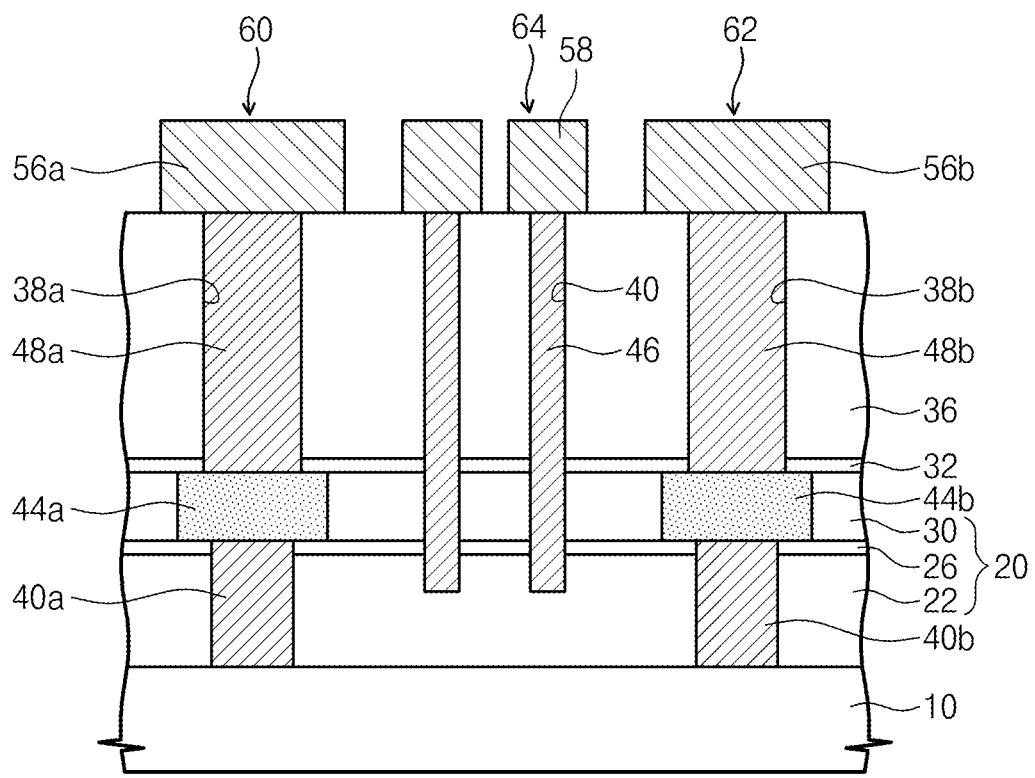

FIGS. 10 and 11 are sectional views schematically illustrating semiconductor devices according to according to still other example embodiments of the inventive concepts. Referring to FIGS. 10 and 11, a semiconductor device according to the present embodiments may be configured to have substantially the same features as those of the semiconductor devices described with reference to FIGS. 2A and 6, except for the number of the shield via plug 46. For example, according to the present embodiments, a pair of shield via structures 64 may be provided between the first and second conductive structures 60 and 62. For example, the pair of shield via plugs 46 may be provided between the first and second conductive structures 60 and 62, and this makes it possible to suppress or prevent copper atoms from being diffused from at least one of the first and second conductive layers 44a and 44b to neighboring elements through interfaces between the first stopper layer 32 and the lower interlayer insulating layer 20 or between the stopper layers 26 and 32 and the second interlayer insulating layer 30. When viewed in a plan view, each of the shield via plugs 46 may be provided to have a linear shape. For example, at least two shield via plugs 46 may enclose a portion of the second conductive structure 62 (for example, the sidewall of the second upper via plug 48b and at least a portion of the sidewall of the second lower conductive layer 44b, or the sidewall of the second upper via plug 48b and the sidewall of the second lower conductive layer 44b and at least a portion of the second lower via plug 40b). In some embodiments, one of the pair of shield via plugs 46 may be provided to enclose a portion of the first conductive structure 60 (for example, the sidewall of the first upper via plug 48a and at least a portion of the sidewall of the first lower conductive layer 44a, or the sidewall of the first upper via plug 48a and the sidewall of the first lower conductive layer 44a and at least a portion of the first lower via plug 40a), and the other of the pair of shield via plugs 46 may enclose a portion of the second conductive structure 62 (for example, the sidewall of the second upper via plug 48b and at least a portion of the sidewall of the second lower conductive layer 44b, or the sidewall of the second upper via plug 48b and the sidewall of the second lower conductive layer 44b and at least a portion of the second lower via plug 40b). Each of the pair of shield via plugs 46 may include the via insulating layer 46b described above. In other embodiments, three or more shield via plugs 46 may be provided between the first and second conductive structures 60 and 62, and each of them may have a linear shape, when viewed in a plan view.

Figure 12:
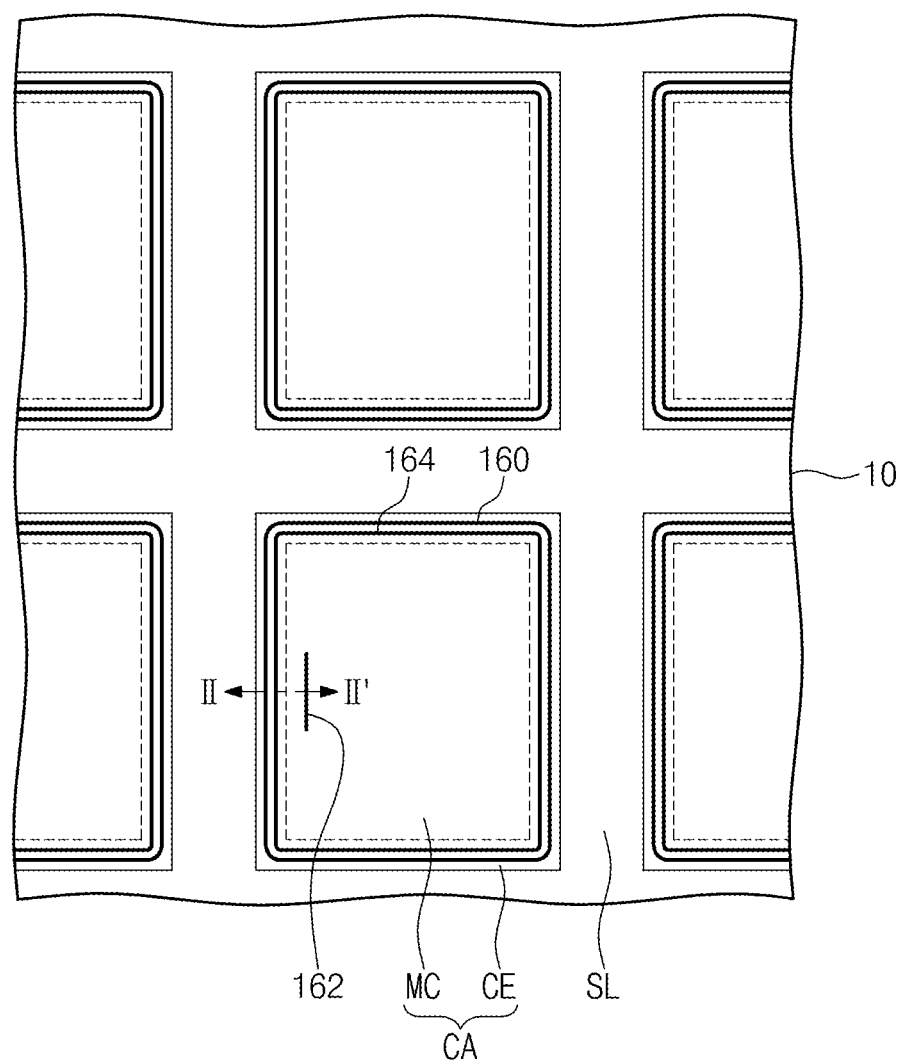
FIG. 12 is a plan view schematically illustrating a semiconductor device according to even other example embodiments of the inventive concepts.
Figure 13:
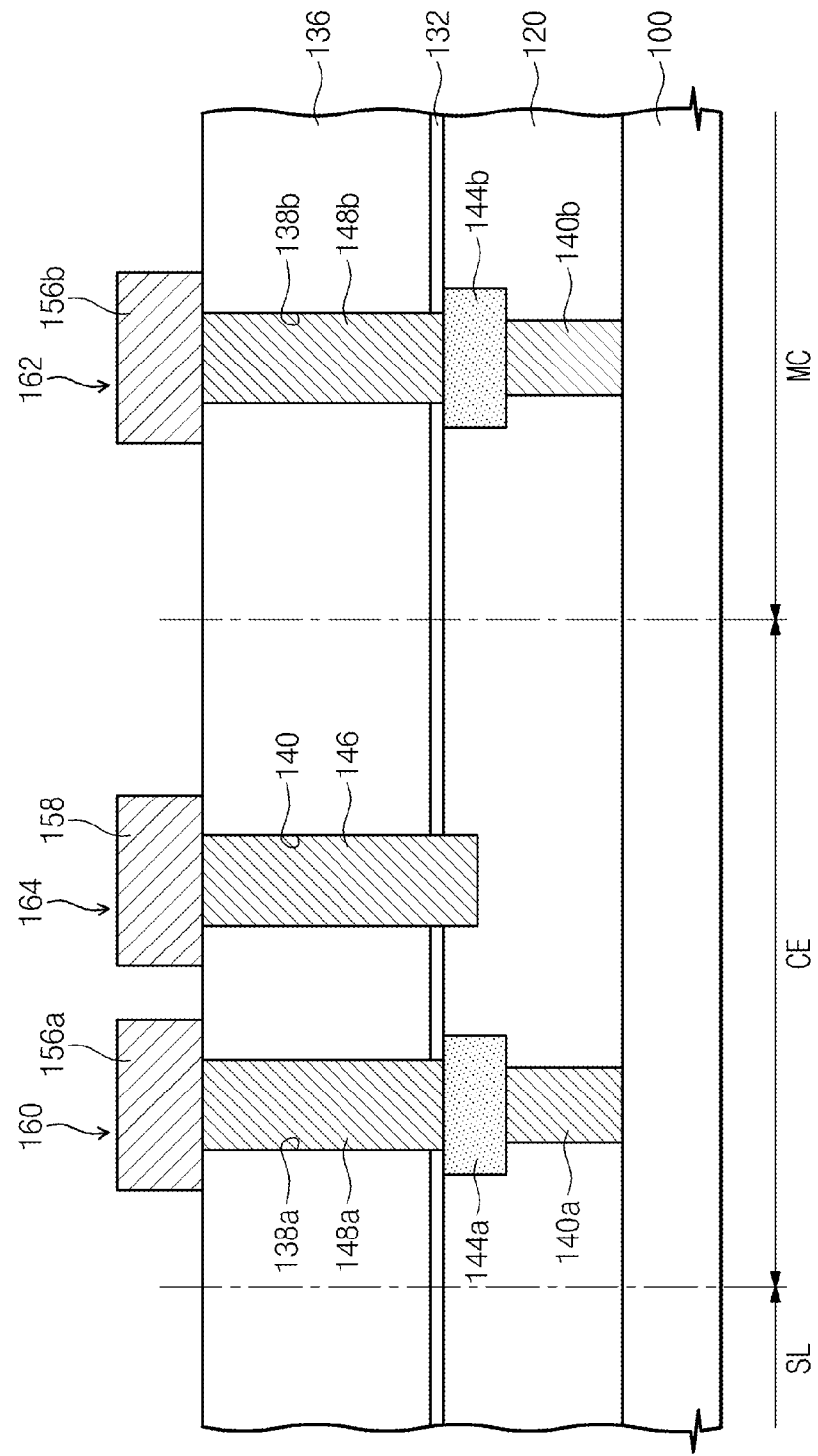
FIGS. 13 and 14 are sectional views taken along line II-II' of FIG. 12 to schematically illustrate semiconductor devices according to even other example embodiments of the inventive concepts.
Figure 14:
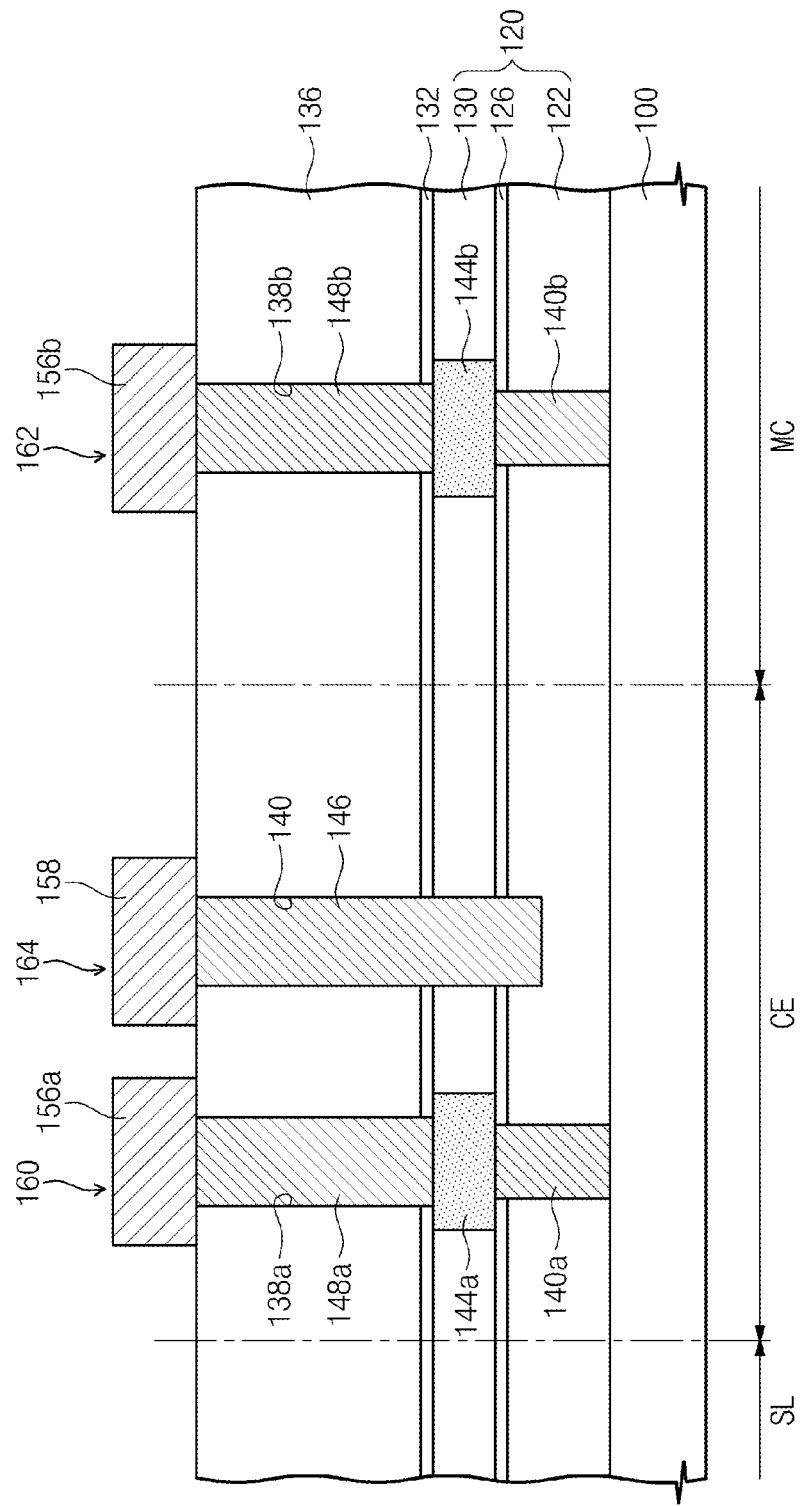

FIG. 12 is a plan view schematically illustrating a semiconductor device according to even other example embodiments of the inventive concepts. FIGS. 13 and 14 are sectional views taken along line II-II' of FIG. 12 to schematically illustrate semiconductor devices according to even other example embodiments of the inventive concepts.

Referring to FIGS. 12 and 13, a semiconductor device may include a scribe lane region SL and a chip region CA. The chip region CA may include a main chip region MC and a chip boundary region CE around the main chip region MC. A conductive structure 162 may be provided on the main chip region MC, and a chip guard ring 160 and a shield via structure 164 may be provided on the chip boundary region CE to enclose the main chip region MC. The chip guard ring 160 may be provided adjacent to the scribe lane region SL, and the shield via structure 164 may be disposed between the chip guard ring 160 and the main chip region MC. The chip guard ring 160 and the shield via structure 164 may be provided in the form of a linear pattern continuously enclosing the main chip region MC. Further, a shield via plug 146 of the shield via structure 164 may be a loop-shaped pattern continuously enclosing the main chip region MC. The substrate 100 may be a substrate (e.g., a wafer) containing a semiconductor material. For example, the semiconductor material may include a silicon-containing material. The main chip region MC may include an integrated circuit (not shown), which may be composed of a plurality of transistors. A lower interlayer insulating layer 120, a first stopper layer 132, and an upper interlayer insulating layer 136 may be formed on the main chip region MC, the chip boundary region CE, and the scribe lane region SL of the substrate 100. Each of the lower and upper interlayer insulating layers 120 and 136 may include a plurality of stacked insulating layers. The conductive structure 162, the shield via structure 164, and the chip guard ring 160 may be provided in or through the lower interlayer insulating layer 120, the first stopper layer 132, and the upper interlayer insulating layer 136.

The interlayer insulating layers 120 and 136 may be formed of or include a doped silicon oxide with a small amount of impurities or an undoped silicon oxide without impurity. For example, the interlayer insulating layers 120 and 136 may be formed of at least oxide material of BSG (boron silicate glass), PSG (phosphorous silicate glass), BPSG (boron phosphorous silicate glass), SiOF (silicon oxy fluoride), SiCHO (silicon carbonic hydro oxide), TEOS (tetra ethyl ortho silicate), or USG (undoped silicate glass). The interlayer insulating layers 120 and 136 may be formed by at least one of various deposition methods, such as a chemical vapor deposition method, in which heat or plasma is used, or a spin-coating method.

The first stopper layer 132 may be formed of a material having an etch selectivity with respect to the upper interlayer insulating layer 136. For example, the first stopper layer 132 may serve as an etch stopper preventing conductive layers 144a and 144b from being etched when the upper interlayer insulating layer 136 is etched. The first stopper layer 132 may be formed of an insulating material, whose density is higher than that of the silicon oxide layer. For example, the first stopper layer 132 may include silicon nitride, silicon carbonitride, or silicon oxynitride. The interlayer insulating layers 120 and 136 may be formed thicker than the first stopper layer 132.

The chip guard ring 160 provided on the chip boundary region CE may include a first lower via plug 140a, a first lower conductive layer a first upper via plug 148a, and a first upper conductive layer 156a, which are sequentially stacked on the substrate 100. The first lower via plug 140a and the first lower conductive layer 144a may be provided in the lower interlayer insulating layer 120. The chip guard ring 160 may be connected to the substrate 100. For example, the first lower via plug 140a may be connected to the substrate 100. In some embodiments, the first lower via plug 140a may be connected to the substrate 100 via at least one conductive layer and at least one via plug provided thereunder. The first lower conductive layer 144a may have a top surface that is substantially coplanar with that of the lower interlayer insulating layer 120. The first upper via plug 148a may be connected to the first lower conductive layer 144a through the upper interlayer insulating layer 136 and the first stopper layer 132. For example, the first upper via plug 148a may be formed by filling a first via trench 138a, which may be formed to penetrate the upper interlayer insulating layer 136 and the first stopper layer 132 formed on the first lower conductive layer 144a, with a conductive layer. The first upper conductive layer 156a may be formed on the upper interlayer insulating layer 136 and be connected to the first upper via plug 148a. Each of the first lower via plug 140a, the first lower conductive layer 144a, the first upper via plug 148a, and the first upper conductive layer 156a of the chip guard ring 160 may be provided in the form of a line-shaped pattern continuously enclosing the main chip region MC, when viewed in a plan view as shown in FIG. 12.

The conductive structure 162 of the main chip region MC may include a second via plug 140b, a second lower conductive layer 144b, a second upper via plug 148b, and a second upper conductive layer 156b. The second lower via plug 140b and the second lower conductive layer 144b may be provided in the lower interlayer insulating layer 120. The conductive structure 162 may be connected to the substrate 100. For example, conductive structure 162 may be connected to circuits integrated on the substrate 100. The second lower via plug 140b may be connected to the substrate 100. In some embodiments, the second lower via plug 140b may be connected to the substrate 100 via at least one conductive layer and at least one via plug provided thereunder. The second lower conductive layer 144b may have a top surface that is substantially coplanar with that of the lower interlayer insulating layer 120. The second upper via plug 148b may be connected to the second lower conductive layer 144b through the upper interlayer insulating layer 136 and the first stopper layer 132. For example, the second upper via plug 148b may be formed by filling a second via trench 138b with a conductive layer. Here, the second via trench 138b is formed to penetrate the upper interlayer insulating layer 136 and the first stopper layer 132 provided on second lower conductive layer 144b. The second upper conductive layer 156b may be formed on the upper interlayer insulating layer 136 and be connected to the second upper via plug 148b.

The via plugs 140a, 140b, 148a, and 148b constituting the chip guard ring 160 and the conductive structure 162 may include a conductive layer. For example, the conductive layer may include tungsten (W). The via plugs 140a, 140b, 148a, and 148b may further include a barrier layer. The barrier layer may include, for example, at least one of titanium (Ti), titanium nitride (TiN), or tungsten nitride (WN). The first lower conductive layer 144a of the chip guard ring 160 and the second lower conductive layer 144b of the conductive structure 162 may be a metal conductive layer. For example, the first and second lower conductive layers 144a and 144b may be formed of or include a copper-containing material. Each of the first and second lower conductive layers 144a and 144b may further include a barrier layer containing at least one of titanium (Ti), titanium nitride (TiN), or tungsten nitride (WN). In the case where the first and second lower conductive layers 144a and 144b are formed of a copper-containing material, it is desirable to suppress or prevent copper atoms from being diffused through an interface between the lower interlayer insulating layer 120 and the first stopper layer 132. In addition, in the case where the interlayer insulating layers 120 and 132 are formed of an oxide-based material and the first stopper layer 132 is formed of a nitride-based material, thermal stresses applied thereto or thermal expansion coefficients thereof may be largely different from each other. Moreover, in the case where a thermal stress is subsequently applied to the semiconductor device with the chip guard ring 160 and conductive structure 164, the gap 33 of FIG. 2B may be formed at the interface between the interlayer insulating layer 120 and the first stopper layer 132, due to weakness of the chip boundary region CE with respect to the thermal stress. The gap 33 may allow copper atoms to be diffused from the first lower conductive layer 144a of the chip guard ring 160 to the main chip region MC, and this may lead to increased possibility for forming short circuits between the first and second lower conductive layers 144a and 144b. That is, it is desirable to suppress the gap 33 from being formed between the lower interlayer insulating layer 120 and the first stopper layer 132 and thereby suppressing or preventing copper atoms from being diffused from the chip guard ring 160 to the main chip region MC. To achieve this, the shield via structure 164 may be provided in the chip boundary region CE or between the chip guard ring 160 and the main chip region MC. The shield via structure 164 may include a shield via plug 146 and a third upper conductive layer 158. The shield via plug 146 may be formed between the first and second upper via plugs 148a and 148b of the chip guard ring 160 and the conductive structure 162 to penetrate the upper interlayer insulating layer 136 and the first stopper layer 132 and extend into the lower interlayer insulating layer 120. The shield via plug 146 may have a bottom surface lower than a top surface of the lower interlayer insulating layer 120. Accordingly, the bottom surface of the shield via plug 146 may be lower than the top surface of the first lower conductive layer 144a of the chip guard ring 160. The top surface of the shield via plug 146 may be substantially coplanar with that of the first and second upper via plugs 148a and 148b. The height of the shield via plug 146 may be greater than that of the first and second upper via plugs 148a and 148b. The shield via plug 146 may be formed in a third via trench 140, which may be formed between the first and second via trenches 138a and 138b of the chip boundary region CE and the main chip region MC on the chip boundary region CE. Here, the third via trench 140 may be formed to penetrate the upper interlayer insulating layer 136 and the first stopper layer 132 and extend into the lower interlayer insulating layer 120. The third via trench 140 may be formed using the same process for forming the first and second via trenches 138a and 138b. In the formation of the first via trench 138a, the second via trench 138b, the third via trench 140, the upper interlayer insulating layer 136 and the stopper layer 132 may over-etched. Here, since there is no conductive layer under the third via trench 140, an etching amount of the lower interlayer insulating layer 120 may be increased. For example, the third via trench 140 may be formed to have a bottom surface lower than the top surface of the first lower conductive layer 144a. Further, the third via trench 140 may be formed to continuously enclose the main chip region MC. The shield via plug 146 may include a conductive layer formed to fill the third via trench 140. The conductive layer for the shield via plug 146 may be the same conductive layer as the first and second upper via plugs 148a and 148b. In other words, the shield via plug 146 may include tungsten (W). The shield via plug 146 may further include a barrier layer enclosing the conductive layer thereof. For example, the barrier layer may include, for example, at least one of titanium (Ti), titanium nitride (TiN), or tungsten nitride (WN). The shield via plug 146 may be formed to penetrate vertically an interface between the stopper layer 132 and the lower interlayer insulating layer 120, and thus, the interface between the stopper layer 132 and the lower interlayer insulating layer 120 may be cut by the shield via plug 146. In addition, since the shield via plug 146 encloses wholly the main chip region MC, it is possible to suppress or prevent copper atoms from being diffused from the first lower conductive layer 144a of the chip guard ring 160 to the main chip region MC. The third upper conductive layer 158 coupled to the shield via plug 146 may be formed on the upper interlayer insulating layer 136. The third upper conductive layer 158 may be provided to be overlapped with the shield via plug 146 and enclose continuously the main chip region MC, but example embodiments of the inventive concepts may not be limited thereto. For example, the third upper conductive layer 158 may be provided to be overlapped with the shield via plug 146 and enclose discontinuously the main chip region MC. The presence of the third upper conductive layer 158 in conjunction with the shield via plug 146 may make it possible to suppress or prevent the gap from being formed between the first stopper layer 132 and the lower interlayer insulating layer 120. In some embodiments, the third upper conductive layer 158 may be concurrently formed by the same process for forming the first and second upper conductive layers 156a and 156b. The third upper conductive layer 158 and the first and second upper conductive layers 156a and 156b may be formed of or include at least one of metal conductive materials (e.g., aluminum (Al) or aluminum alloys). The shield via structure 164 may be configured to include only the shield via plug 146, without the third upper conductive layer 158. The shield via structure 164 may not be connected to other conductive structures and may not be used as an interconnection line. In other words, the shield via plug 146 may be in an electrically-floating state.

Referring to FIGS. 12 and 14, a semiconductor device may include the lower interlayer insulating layer 120, the first stopper layer 132, the upper interlayer insulating layer 136, the chip guard ring 160, the conductive structure 162, and the shield via structure 164, which are formed on the substrate 100. The substrate 100 may include the scribe lane region SL, the chip boundary region CE, and the main chip region MC. The chip guard ring 160 and the conductive structure 162 may be connected to the substrate 100. For example, the chip guard ring 160 and the conductive structure 162 may be connected to the integrated circuit of the substrate 100. The lower interlayer insulating layer 120 may include a first interlayer insulating layer 122, a second stopper layer 126, and a second interlayer insulating layer 130. Each of the first interlayer insulating layer 122 and the upper interlayer insulating layer 136 may include a plurality of stacked insulating layers. Each of the chip guard ring 160 and the conductive structure 162 may be provided through or in the first interlayer insulating layer 122, the second stopper layer 126, the second interlayer insulating layer 130, the first stopper layer 132, and the upper interlayer insulating layer 136. The first and second interlayer insulating layers 122 and 130 may include the same insulating material as the upper interlayer insulating layer 136. Further, the second stopper layer 126 may also include the same insulating material as the first stopper layer 132. The interlayer insulating layers 122, 130, and 136 may be formed to be thicker than each of the stopper layers 126 and 132.

The chip guard ring 160 on the chip boundary region CE may include the first lower via plug 140a, the first lower conductive layer 144a, the first upper via plug 148a, and the first upper conductive layer 156a, which are sequentially stacked on the substrate 100. The conductive structure 162 on the main chip region MC may include the second conductive via plug 140b, the second lower conductive layer 144b, the second upper via plug 148b, and the second upper conductive layer 156b. The first and second upper via plugs 148a and 148b may be formed to penetrate vertically the second stopper layer 126 and the first interlayer insulating layer 122. The first and second lower conductive layers 144a and 144b may be provided in the second interlayer insulating layer 130 and between the first and second stopper layers 132 and 126. In other words, the first and second lower conductive layers 144a and 144b may have top and bottom surfaces that are in contact with the first and second stopper layers 132 and 126, respectively, and are substantially coplanar with top and bottom surfaces, respectively, of the second interlayer insulating layer 130. The first and second upper via plugs 148a and 148b may be connected to the first and second lower conductive layers 144a and 144b, respectively, through the upper interlayer insulating layer 136 and the first stopper layer 132. The first and second upper conductive layers 156a and 156b may be formed on the upper interlayer insulating layer 136.

The shield via structure 164 may include the shield via plug 146 penetrating the upper interlayer insulating layer 136 and extending into the lower interlayer insulating layer 120 and the third upper conductive layer 158 provided on the upper interlayer insulating layer 136. For example, the shield via plug 146 may be provided to vertically penetrate the upper interlayer insulating layer 136, the first stopper layer 132, the second interlayer insulating layer 130, and the second stopper layer 126 and extend into the first interlayer insulating layer 122, thereby cutting the interfaces between the stopper layers 126 and 132 and the second interlayer insulating layer 130. The shield via plug 146 may be provided to enclose the main chip region MC and may be, for example, a loop-shaped pattern, when viewed in a plan view as shown in FIG. 12. The shield via plug 146 may have a bottom surface that is lower than the bottom surfaces of the first and second lower conductive layers 144a and 144b. The shield via structure 164 may include only the shield via plug 146, without the third upper conductive layer 158. The shield via structure 164 may not be connected to the substrate 100 and may not be used as an interconnection line. In other words, the shield via plug 146 may be in an electrically-floating state.

Figure 15:
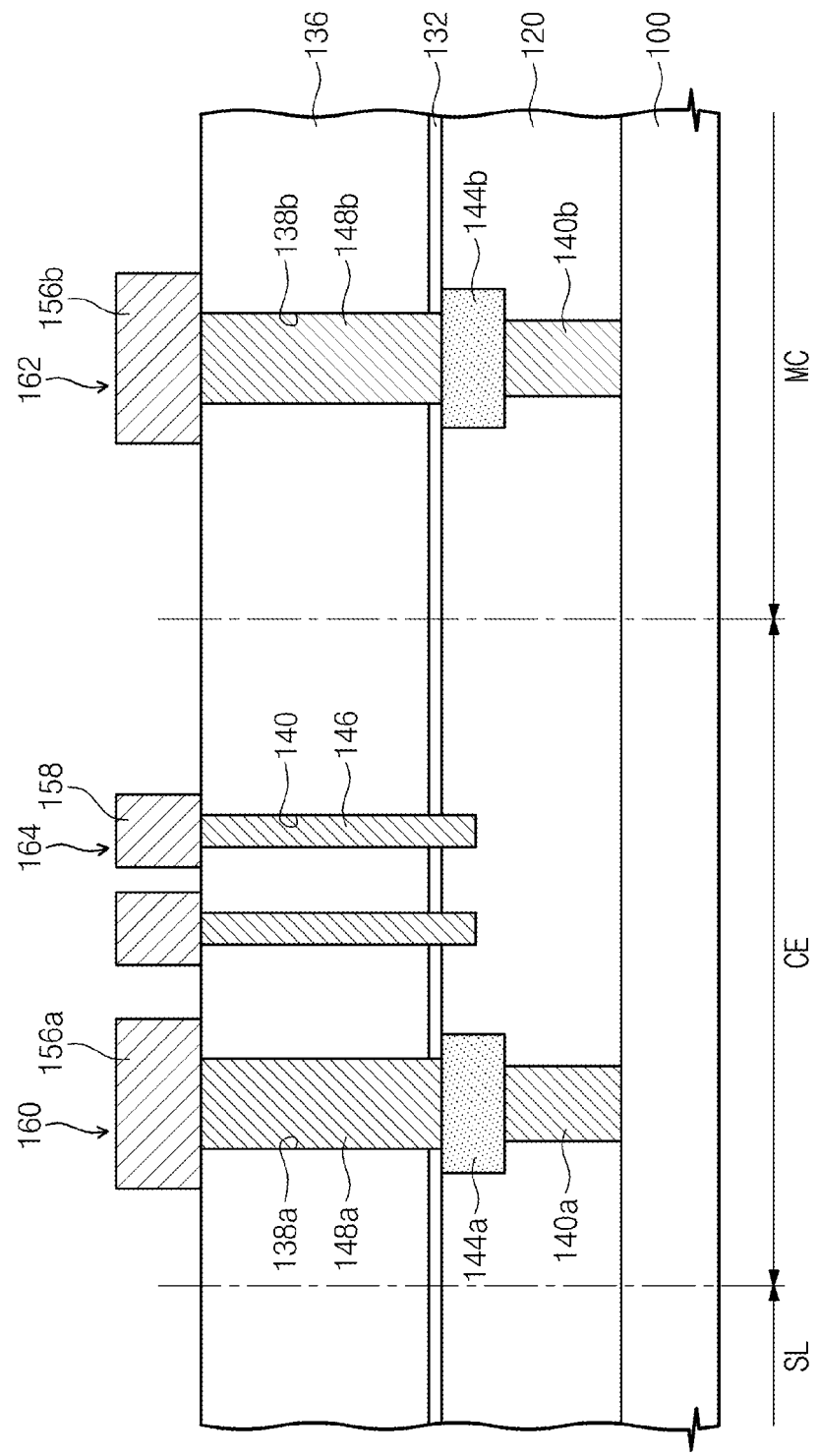
FIGS. 15 and 16 are sectional views schematically illustrating semiconductor devices according to yet example embodiments of the inventive concepts.
Figure 16:
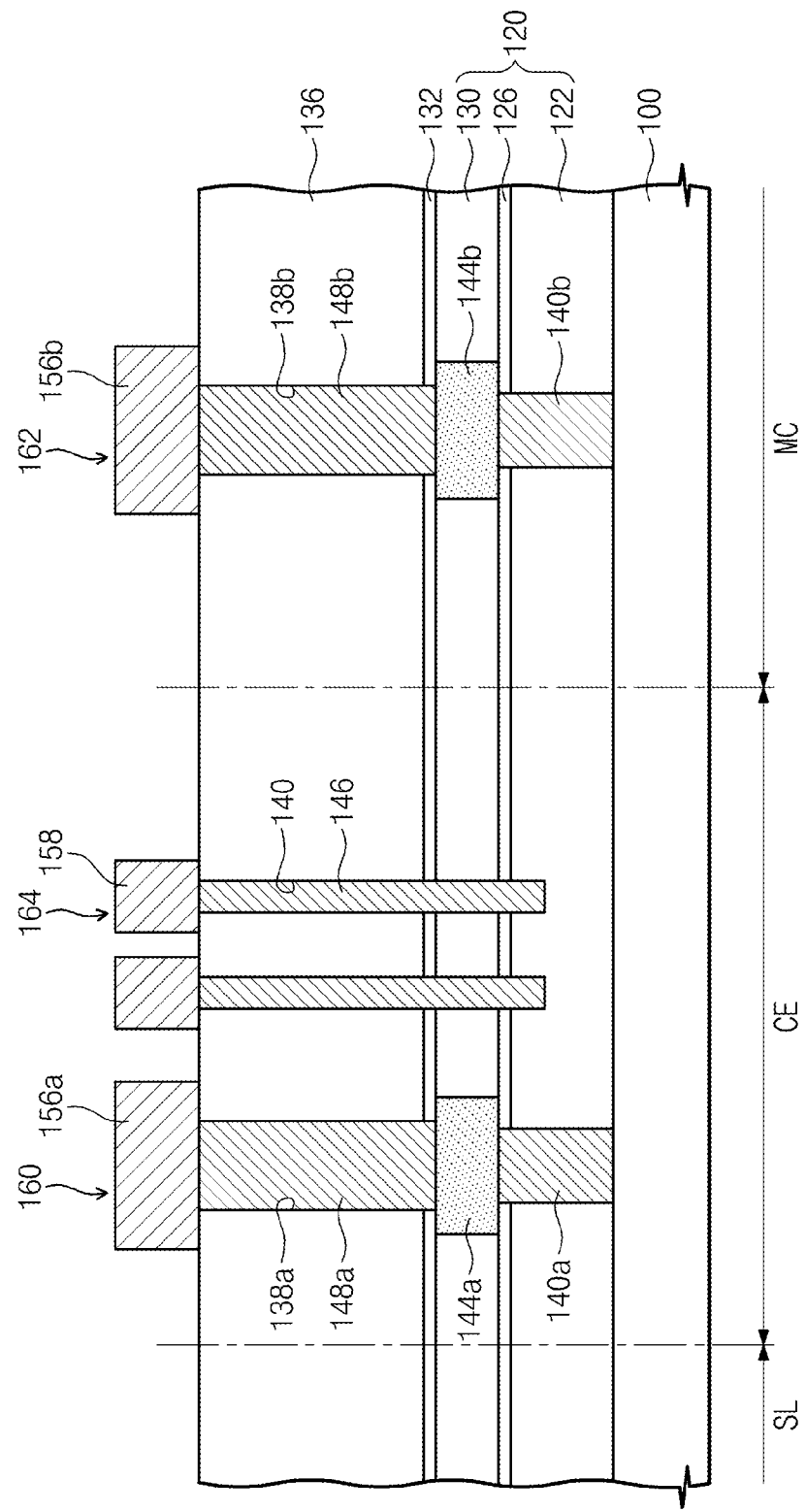

FIGS. 15 and 16 are sectional views schematically illustrating semiconductor devices according to yet example embodiments of the inventive concepts. Referring to FIGS. 15 and 16, a semiconductor device according to the present embodiments may be configured to have substantially the same features as those of the semiconductor devices described with reference to FIGS. 13 and 14, except for the number of the shield via plug 146. A pair of shield via plugs 146 may be formed on the chip boundary region CE. The pair of shield via plugs 146 may be disposed between the chip guard ring 160 and the main chip region MC to suppress or prevent copper atoms from being diffused from the chip guard ring 160 to the conductive structure 162 of the main chip region MC through the interfaces between the first stopper layer 132 and the lower interlayer insulating layer 120 or between the second interlayer insulating layer 130 and the stopper layers 126 and 132. When viewed in a plan view, the pair of shield via structures 164 may be provided to enclose the main chip region MC. In other words, at least two shield via plugs 146 may enclose the main chip region MC. For example, the pair of shield via plugs 146 may be provided to enclose continuously the sidewall of the second upper via plug 148b of the conductive structure 162 and at least a portion of the sidewall of the second lower conductive layer 144b, or the sidewall of the second upper via plug 148b of the conductive structure 162 and the sidewall of the second lower conductive layer 144b and at least a portion of the sidewall of the second lower via plug 148b. In other embodiments, when viewed in a plan view, three or more shield via structures 164 may be continuously provided on the chip boundary region CE between the chip guard ring 160 and the main chip region MC to enclose the main chip region MC. The shield via structure 164 may not be connected to the substrate 100. The shield via plug 146 may be in an electrically-floating state.

FIGS. 17 through 21 are sectional views taken along line mu of FIG. 12 to schematically illustrate semiconductor devices according to further example embodiments of the inventive concepts.

Figure 17:
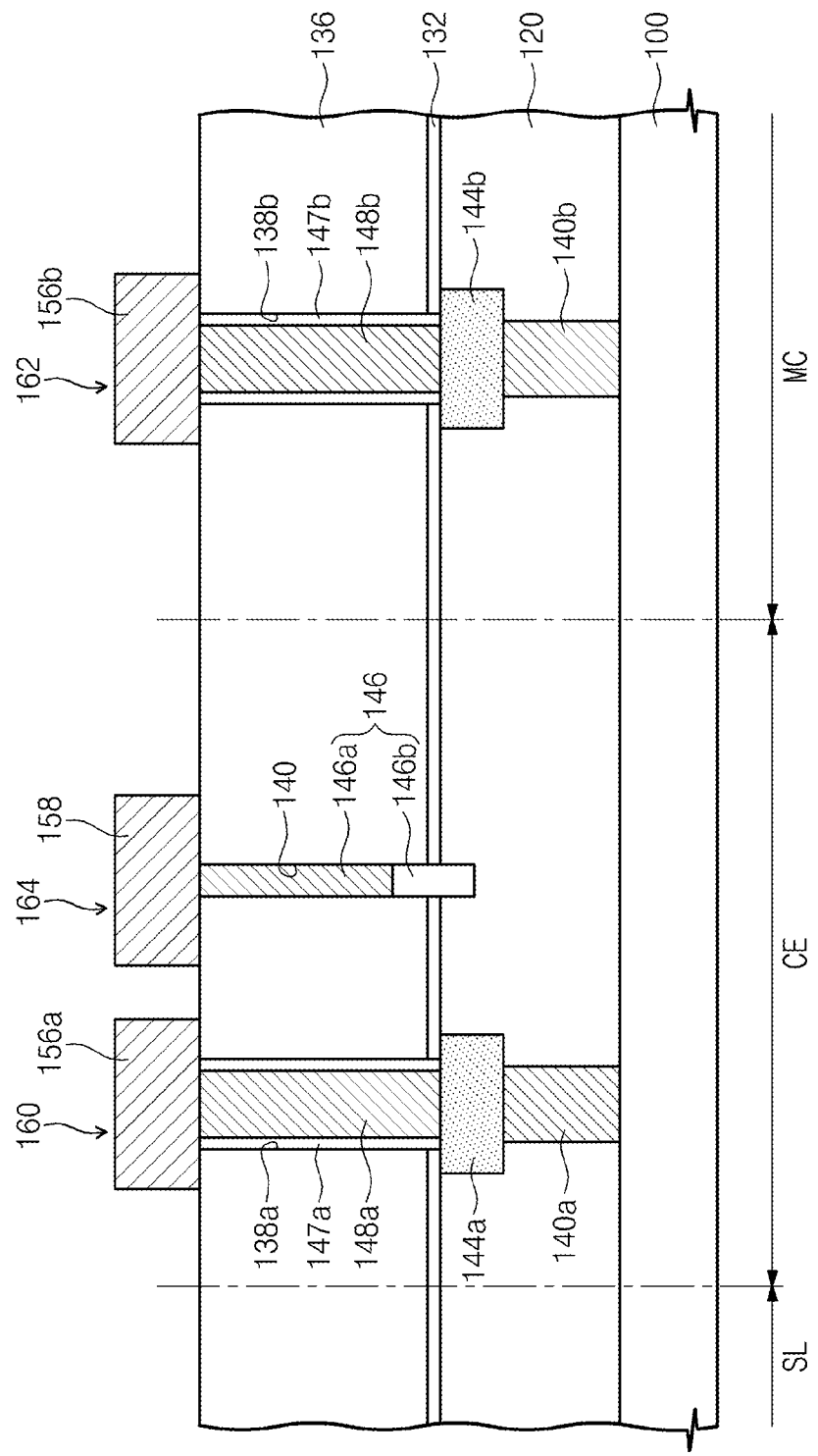
FIGS. 17 through 21 are sectional views taken along line II-II' of FIG. 12 to schematically illustrate semiconductor devices according to further example embodiments of the inventive concepts.
Figure 18:
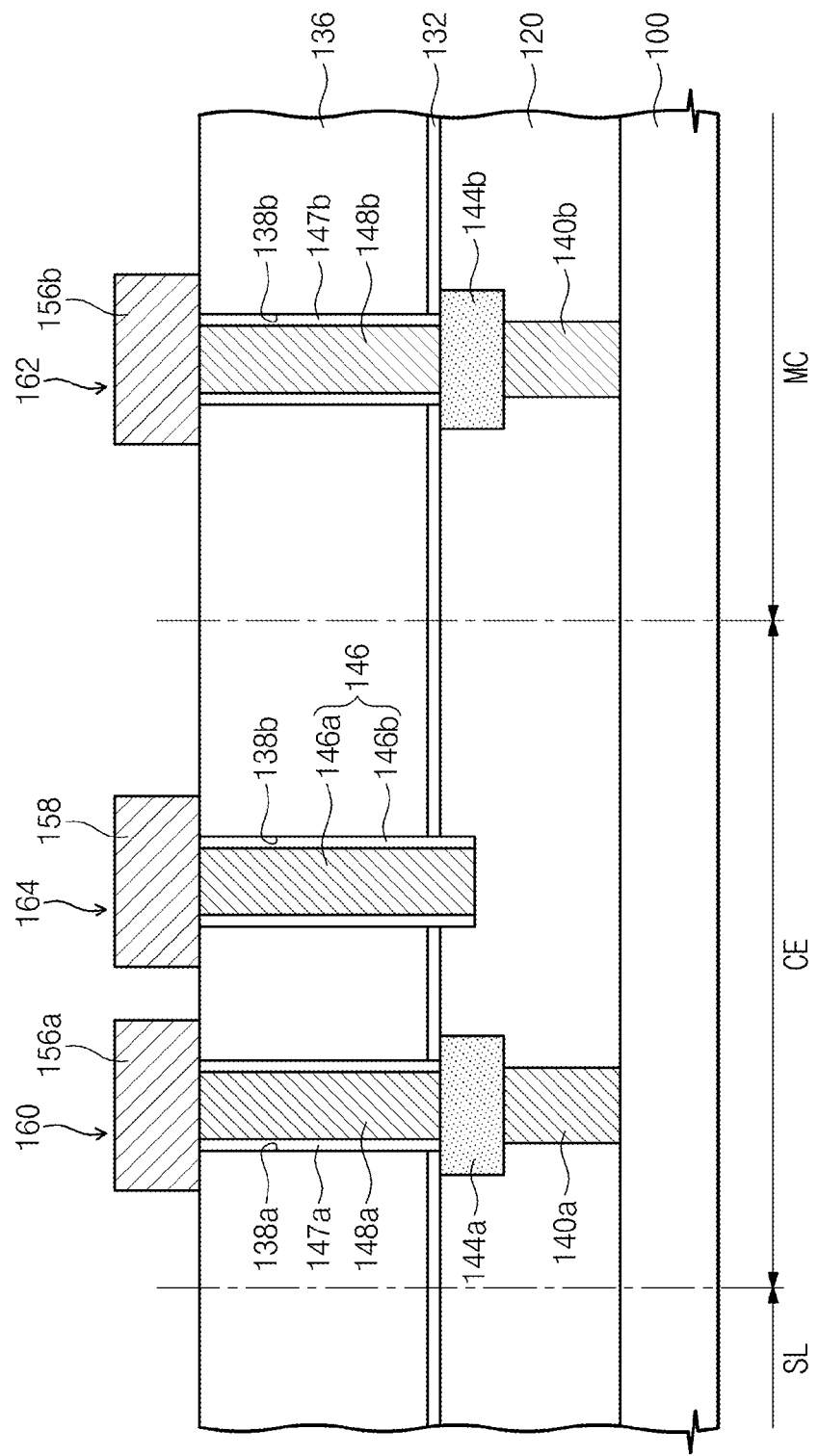
Figure 19:
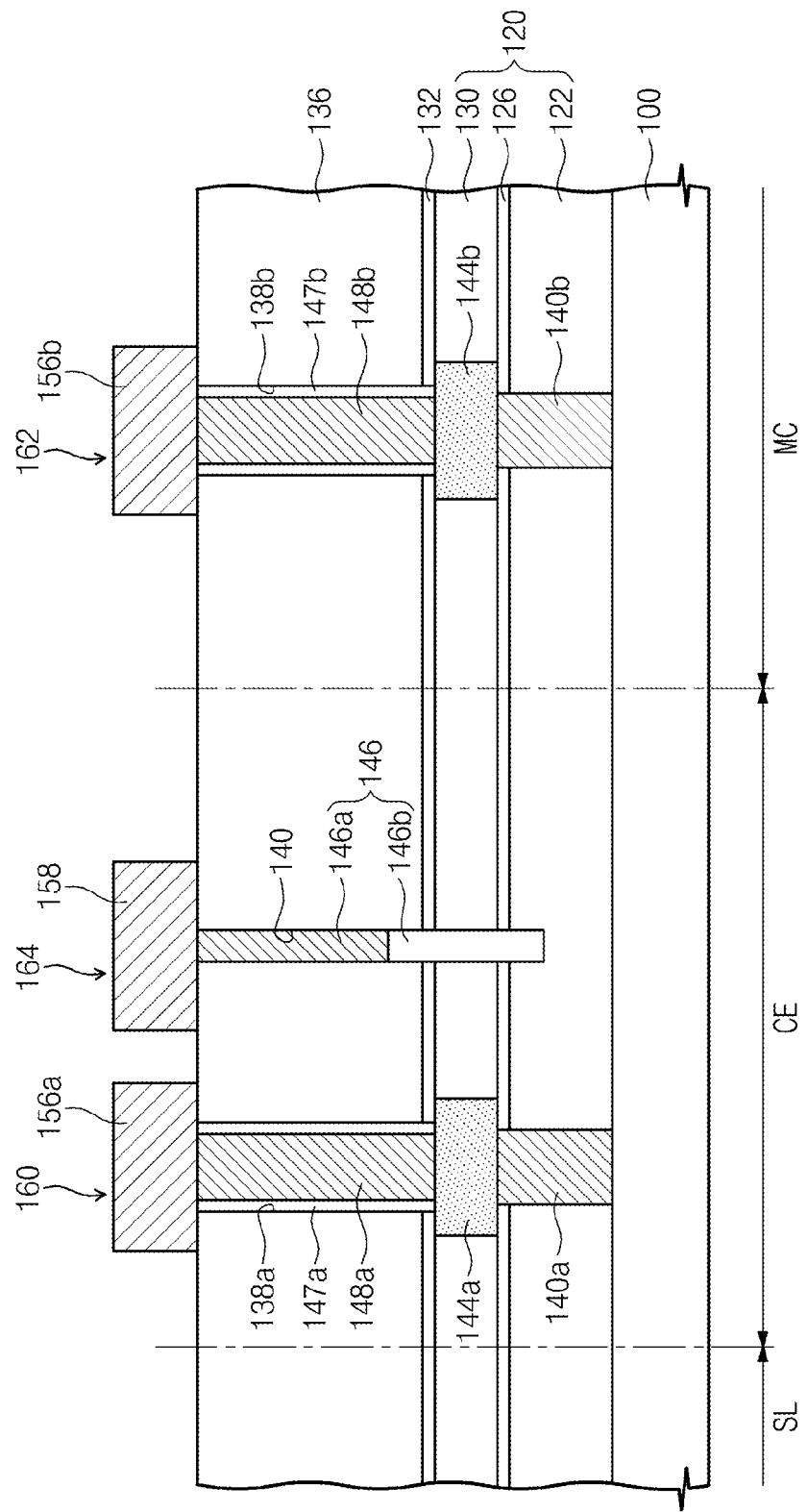
Figure 20:
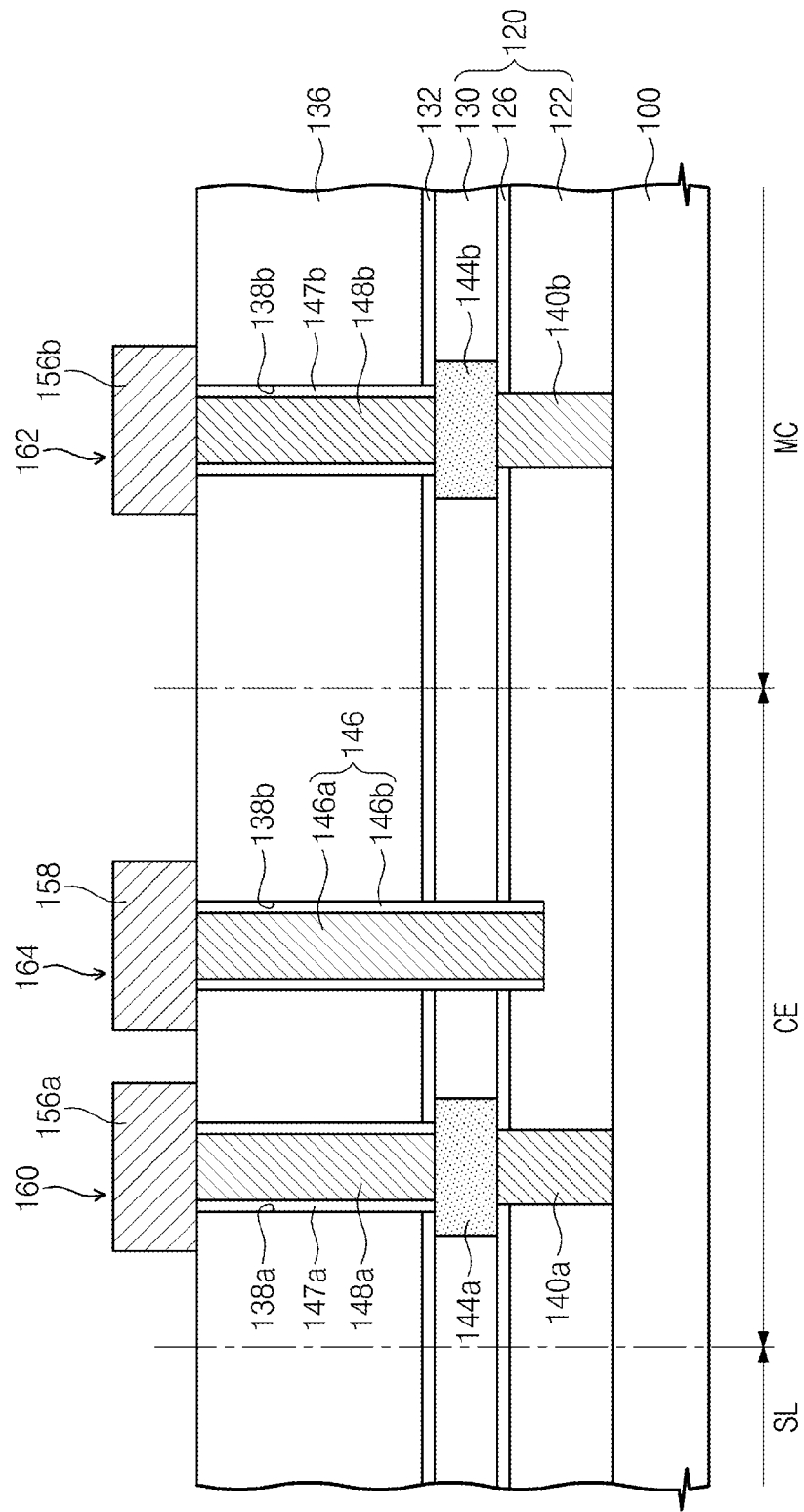
Figure 21:
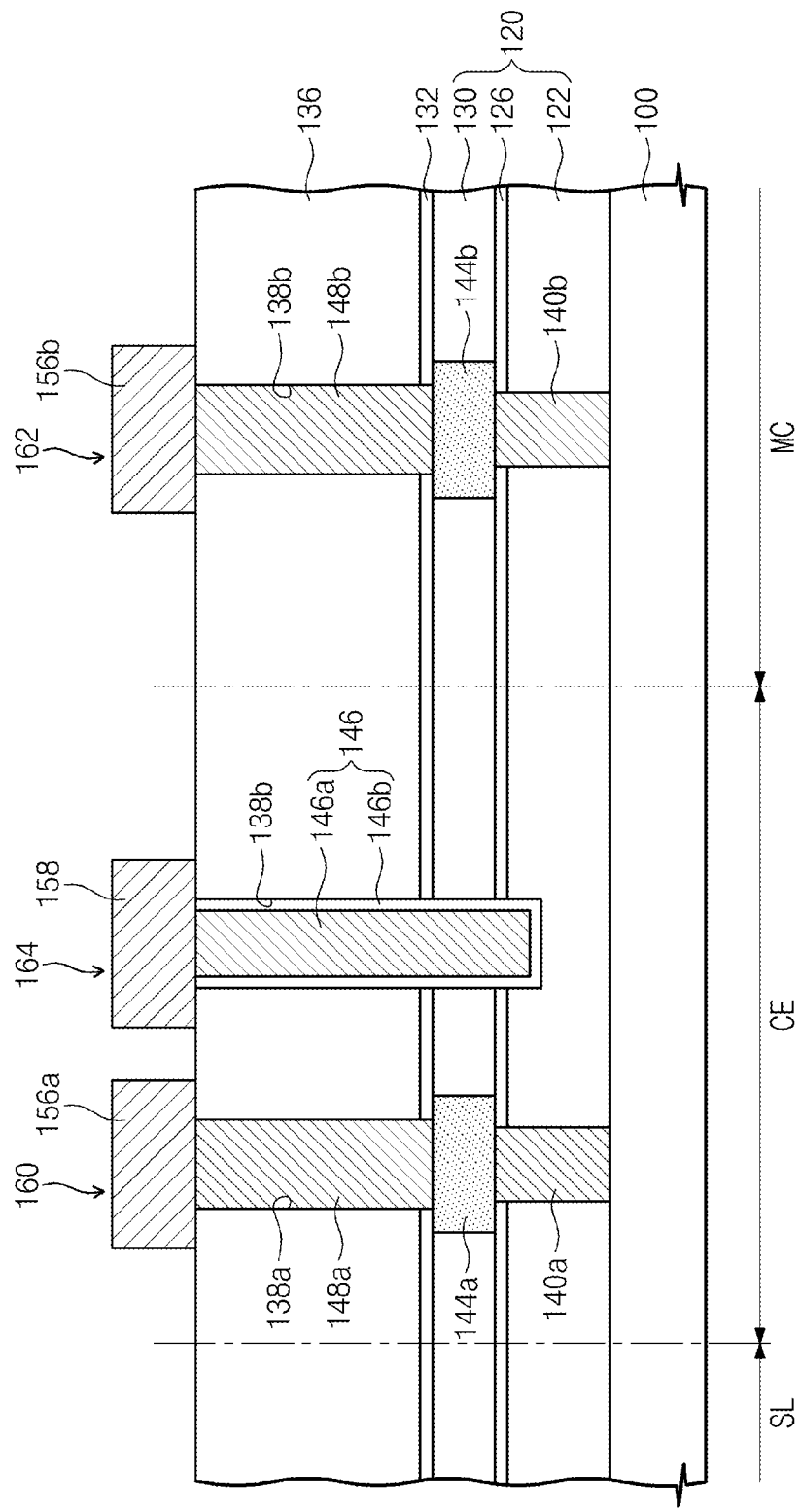

Referring to FIGS. 17 through 21 in conjunction with FIG. 12, the shield via plug 146 of the shield via structure 164 may include a shield via conductive layer 146a and a shield via insulating layer 146b coupled thereto. The shield via insulating layer 146b and disposed on at least one of side and/or bottom surfaces of the shield via conductive layer 146a. Referring to FIG. 17, the shield via insulating layer 146b may be provided below the shield via conductive layer 146a to penetrate a portion of the upper interlayer insulating layer 136 and the first stopper layer 132 and extend into the lower interlayer insulating layer 120. In this case, an interface between the lower interlayer insulating layer 120 and the first stopper layer 132 may be cut by the shield via insulating layer 146b, and thus, it is possible to suppress or prevent copper atoms from being diffused from the chip guard ring 160 to neighboring elements. Referring to FIG. 19, the shield via insulating layer 146b may be provided to penetrate a portion of the upper interlayer insulating layer 136, the first and second stopper layers 132 and 126, and the second interlayer insulating layer 130 and extend into the first interlayer insulating layer 122. In this case, the interfaces between the stopper layers 132 and 126 and the second interlayer insulating layer 130 may be cut by the shield via insulating layer 146b, and thus, it is possible to suppress or prevent copper atoms from being diffused from the chip guard ring 160 to neighboring elements. A first via insulating layer 147a may be formed on the sidewall of the first upper via plug 148a, and a second via insulating layer 147b may be formed on the sidewall of the second upper via plug 148b. Referring to FIGS. 18, 20 and 21, the shield via insulating layer 146b may be provided on the sidewall of the shield via conductive layer 146a to penetrate the upper interlayer insulating layer 136 and the first stopper layer 132 and extend into the lower interlayer insulating layer 120 or to penetrate the upper interlayer insulating layer 136, the first and second stopper layers 132 and 126, and the second interlayer insulating layer 130 and extend into the first interlayer insulating layer 122. Accordingly, it is possible to suppress or prevent copper atoms from being diffused from the chip guard ring 160 to neighboring elements through the interfaces between the first stopper layer 132 and the lower interlayer insulating layer 20 or between the first and second stopper layers 132 and 126 and the second interlayer insulating layer 130. The shield via insulating layer 146b may be provided to enclose the sidewall of the shield via conductive layer 146a. In the meantime, referring to FIG. 21, the shield via insulating layer 146b may be provided on side and bottom surfaces of the shield via conductive layer 146a. For example, the shield via insulating layer 146b may be formed to cover the side and bottom surfaces of the shield via conductive layer 146a. In some embodiments, the first and second via insulating layers 147a and 147b as shown in FIG. 17 through 21 may not be provided on the sidewalls of the first and second upper via plugs 148a and 148b. As described above and shown in FIGS. 17 through 21, the shield via plugs 146 may be provided between the chip guard ring 160 and the main chip region MC to continuously enclose the main chip region MC. Further, as shown in FIGS. 17 through 21, the shield via plugs 146 may not be connected to the substrate 100 and may be disposed spaced apart from the substrate 100. The shield via plug 146 may be in an electrically-floating state.

Figure 22:
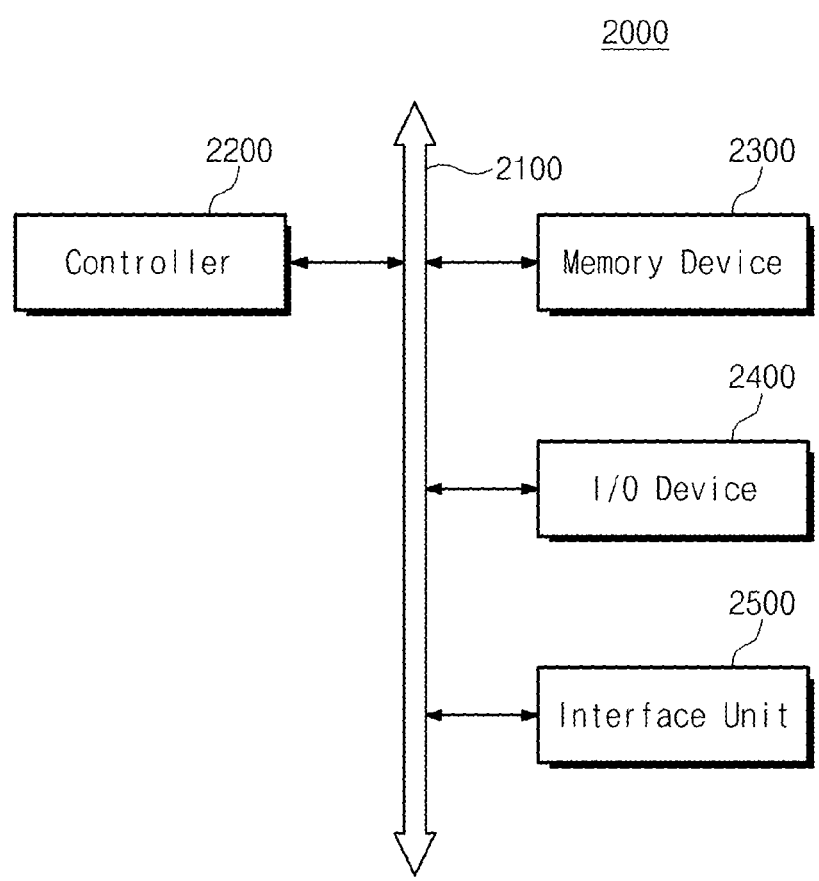
FIG. 22 is a schematic block diagram illustrating an example of electronic systems including a semiconductor device according to example embodiments of the inventive concepts.

FIG. 22 is a schematic block diagram illustrating an example of electronic systems including a semiconductor device according to example embodiments of the inventive concepts.

Referring to FIG. 22, an electronic system 2000 according to embodiments may include a controller 2200, a memory device 2300, and an input/output (I/O) device 2400, and a data bus 2100. At least two of the controller 2200, the I/O device 2400 and the memory device 2300 may communicate with each other through the data bus 2100. The data bus 2100 may correspond to a path through which electrical signals are transmitted. The controller 2200 may include at least one of a microprocessor, a digital signal processor, a microcontroller and a logic device. The logic device may have a similar function to any one of the microprocessor, the digital signal processor and the microcontroller. The I/O device 2400 may include at least one of a keypad, a keyboard and a display device. The memory device 2300 may store data and/or commands executed by the controller 2200. The memory device 2300 may include a volatile memory device and/or a nonvolatile memory device. For example, the memory device 2300 may include a flash memory device. The flash memory device may constitute a solid state disk (SSD). In this case, the solid state disk including the flash memory device may stably store a large capacity of data. The controller 2200 and/or the memory device 2300 may include at least one of the semiconductor devices described in the above embodiments. The electronic system 2000 may further include an interface unit 2500. The interface unit 2500 may transmit data to a communication network or may receive data from a communication network. The interface unit 2500 may operate by wireless or cable. For example, the interface unit 2500 may include an antenna for wireless communication or a transceiver for cable communication.

According to example embodiments of the inventive concepts, the semiconductor device may be configured to prevent a gap region from being formed at an interface between a stopper layer and an interlayer insulating layer and thereby to suppress or prevent copper atoms from being diffused through such a gap region. Accordingly, it is possible to effectively avoid short circuits between conductive layers.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
  a lower interlayer insulating layer, a first stopper layer, and an upper interlayer insulating layer sequentially stacked on a substrate;
  first and second lower conductive layers provided in the lower interlayer insulating layer and laterally separated from each other;
  first and second upper via plugs penetrating the upper interlayer insulating layer and the first stopper layer, the first and second upper via plugs connected to the first and second lower conductive layers, respectively;
  a shield via plug provided between the first and second upper via plugs to penetrate the first stopper layer and extend from the upper interlayer insulating layer into the lower interlayer insulating layer; and
  first, second, and third upper conductive layers provided on the upper interlayer insulating layer and connected to the first upper via plug, the second upper via plug, and the shield via plug, respectively,
  wherein the shield via plug has a line-shaped pattern in a plan view, comprises a conductive layer, and is electrically separated from the first and second lower conductive layers.

2. The device of claim 1, wherein the shield via plug is provided to enclose a sidewall of the second upper via plug and at least a portion of a sidewall of the second lower conductive layer.

3. The device of claim 1, wherein the shield via plug comprises a conductive layer and a via insulating layer provided on at least a side surface of the conductive layer.

4. The device of claim 1, wherein the shield via plug comprises a conductive layer and a via insulating layer provided under the conductive layer.

5. The device of claim 1, wherein the lower interlayer insulating layer comprises a first interlayer insulating layer, a second stopper layer, and a second interlayer insulating layer, which are sequentially stacked on the substrate, and the second interlayer insulating layer is provided between the second stopper layer and the first stopper layer.

6. The device of claim 5, wherein the shield via plug is provided to penetrate the first stopper layer, the second interlayer insulating layer, and the second stopper layer and extend from the upper interlayer insulating layer into the first interlayer insulating layer.

7. The device of claim 1, further comprising:
  first and second lower via plugs provided in the lower interlayer insulating layer and connected to the first and second lower conductive layers, respectively.

8. The device of claim 1, wherein the shield via plug is not connected to the substrate.

9. A semiconductor device, comprising:
  a substrate including a main chip region, a scribe lane region, and a chip boundary region between the main chip region and the scribe lane region;
  a plurality of interlayer insulating layers provided on the substrate, the plurality of interlayer insulating layers including at least one stopper layer;
  a conductive structure provided in the plurality of interlayer insulating layers on the main chip region;
  a chip guard ring provided in the plurality of interlayer insulating layers on the chip boundary region to enclose continuously the main chip region, the chip guard ring connected to the substrate; and
  a shield via plug provided between the chip guard ring and the main chip region to enclose continuously the main chip region, and the shield via plug penetrates the at least one stopper layer of the plurality of interlayer insulating layers, the shield via plug spaced apart from the substrate,
  wherein the shield via plug comprises conducting material and at least a bottom surface of the shield via plug is electrically separated from the conductive structure.

10. The device of claim 9, wherein more than one of the shield via plug is at the chip boundary region.

11. The device of claim 9, wherein the plurality of interlayer insulating layers comprises a lower interlayer insulating layer, a first stopper layer, and an upper interlayer insulating layer sequentially stacked on the substrate, and
  the shield via plug extends from the upper interlayer insulating layer into the lower interlayer insulating layer through the first stopper layer.

12. The device of claim 11, wherein each of the conductive structure and the chip guard ring comprises a lower via plug, a lower conductive layer, an upper via plug, and an upper conductive layer, and wherein the lower via plug and the lower conductive layer are sequentially stacked in the lower interlayer insulating layer, the upper via plug is connected to the lower conductive layer through the upper interlayer insulating layer and the first stopper layer, and the upper conductive layer is provided on the upper interlayer insulating layer and is connected to the upper via plug.

13. The device of claim 9, wherein the plurality of interlayer insulating layers comprise a first interlayer insulating layer, a first stopper layer, a second interlayer insulating layer, a second stopper layer, and a third interlayer insulating layer sequentially stacked on the substrate, the shield via plug penetrates the third interlayer insulating layer, the second stopper layer, the second interlayer insulating layer, and the first stopper layer, and the shield via plug extends into the first interlayer insulating layer.

14. The device of claim 13, wherein each of the conductive structure and the chip guard ring comprises a lower via plug, a lower conductive layer, an upper via plug, and an upper conductive layer, and wherein the lower via plug is provided in the first interlayer insulating layer and the first stopper layer, the lower conductive layer is provided in the second interlayer insulating layer and is connected to the lower via plug, the upper via plug is connected to the lower conductive layer through the second stopper layer and the third interlayer insulating layer, and the upper conductive layer is provided on the third interlayer insulating layer and is connected to the upper via plug.

15. The device of claim 9, wherein the shield via plug comprises a conductive layer and a via insulating layer that is disposed on a side or bottom surface of the conductive layer.

16. The device of claim 9, wherein the shield via plug is not connected to the substrate.

17. A semiconductor device, comprising:

a substrate including a main chip region, a scribe lane region, and a chip boundary region between the main chip region and the scribe lane region;

a plurality of interlayer insulating layers provided on the substrate, the plurality of interlayer insulating layers including at least one stopper layer;

a conductive structure provided in the plurality of interlayer insulating layers on the main chip region, the conductive structure comprising a first lower via plug, a first conductive layer, and a first upper via plug, wherein the first lower via plug is connected to the substrate, the first conductive layer is provided on the first lower via plug and is connected to the first lower via plug, and the first upper via plug is provided on the first conductive layer and is connected to the first conductive layer;

a chip guard ring provided in the plurality of interlayer insulating layers on the chip boundary region, the chip guard ring continuously enclosing the main chip region, the chip guard ring comprising a second lower via plug, a second conductive layer, and a second upper via plug, wherein the second lower via plug is connected to the substrate, the second conductive layer is provided on the second lower via plug and is connected to the second lower via plug, and the second upper via plug is provided on the second conductive layer and is connected to the second conductive layer; and a shield via plug provided in the plurality of interlayer insulating layers on the chip boundary region to enclose continuously the main chip region and provided between the conductive structure and the chip guard ring, to penetrate the at least one stopper layer of the plurality of interlayer insulating layers, the shield via plug spaced apart from the substrate and at least a bottom surface of the shield via plug being electrically separated from the first conductive layer and the second conductive layer, wherein the shield via plug comprises the same conducting material as the second upper via plug.

18. The device of claim 17, wherein a top surface of the shield via plug is substantially on a same level as a top surface of the second upper via plug, and a height of the shield via plug is greater than that of the second upper via plug.

19. The device of claim 17, wherein the shield via plug is not connected to the substrate.

20. A semiconductor device, comprising:

a lower interlayer insulating layer, a first stopper layer, and an upper interlayer insulating layer sequentially stacked on a substrate;

first and second lower conductive layers provided in the lower interlayer insulating layer and laterally separated from each other;

first and second upper via plugs penetrating the upper interlayer insulating layer and the first stopper layer, the first and second upper via plugs connected to the first and second lower conductive layers, respectively; and a shield via plug provided between the first and second upper via plugs to penetrate the first stopper layer and extend from the upper interlayer insulating layer into the lower interlayer insulating layer, wherein the shield via plug has a line-shaped pattern in a plan view, comprises a conductive layer, and is electrically separated from the first and second lower conductive layers, and wherein the shield via plug is provided to enclose a sidewall of the second upper via plug and at least a portion of a sidewall of the second lower conductive layer.

* * * * *